(12) United States Patent
Kim et al.

(10) Patent No.: US 10,756,073 B2
(45) Date of Patent: Aug. 25, 2020

(54) MICRO LED MODULE WITH FLEXIBLE MULTILAYER CIRCUIT SUBSTRATE

(71) Applicant: LUMENS CO., LTD., Yongin-si, Gyeonggi-do (KR)

(72) Inventors: Daewon Kim, Yongin-si (KR); Taehong Jeong, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 0 days.

(21) Appl. No.: 16/011,573

(22) Filed: Jun. 18, 2018

(65) Prior Publication Data

US 2020/0066693 A1    Feb. 27, 2020

(30) Foreign Application Priority Data

Feb. 13, 2018  (KR) .................. 10-2018-0017369
Mar. 2, 2018   (KR) .................. 10-2018-0025021
Apr. 27, 2018  (KR) .................. 10-2018-0049372

(51) Int. Cl.
*H01L 25/13*    (2006.01)
*H01L 33/62*    (2010.01)
*H01L 23/538*   (2006.01)

(52) U.S. Cl.
CPC .......... *H01L 25/13* (2013.01); *H01L 23/5383* (2013.01); *H01L 23/5384* (2013.01); *H01L 23/5387* (2013.01); *H01L 33/62* (2013.01)

(58) Field of Classification Search
CPC ..... H01L 33/62; H01L 23/53; H01L 23/5383; H01L 23/5384; H01L 23/5387; H01L 25/13
See application file for complete search history.

(56) References Cited

U.S. PATENT DOCUMENTS

2002/0113246 A1*  8/2002  Nagai ............... H01R 13/7175
                                                              257/99
2014/0159043 A1*  6/2014  Sakariya ............... H01L 27/124
                                                              257/59
(Continued)

FOREIGN PATENT DOCUMENTS

JP    10-2012-0018013 A    2/2012
JP       2014-103261 A     6/2014
(Continued)

*Primary Examiner* — Fazli Erdem
(74) *Attorney, Agent, or Firm* — Mei & Mark LLP

(57) ABSTRACT

A micro-LED module is disclosed. The micro-LED module includes a flexible circuit board and a plurality of LED pixels mounted on the flexible circuit board. Each of the plurality of LED pixels includes a first micro-LED chip, a second micro-LED chip, and a third micro-LED chip. Each of the first micro-LED chip, the second micro-LED chip, and the third micro-LED chip has at least one side whose length is 100 μm or less. Each of the first micro-LED chip, the second micro-LED chip, and the third micro-LED chip includes one or more electrode pads having a width of 80 μm or less on the surface facing the flexible circuit board. The flexible circuit board includes a first flexible insulating film including electrode patterns formed on the upper surface thereof and connected to the electrode pads through solder bumps having a diameter of 80 μm or less and a second flexible insulating film connected to the bottom of the first flexible insulating film through a first conductive pattern. The first flexible insulating film includes a first via hole having the same cross-sectional shape and area from the upper to the lower end and a first via formed in the first via hole. The first via hole of the first flexible insulating film is connected to a portion of the first conductive pattern.

13 Claims, 19 Drawing Sheets

(56) References Cited

U.S. PATENT DOCUMENTS

| | | | | |
|---|---|---|---|---|
| 2015/0169011 A1* | 6/2015 | Bibl | ...................... | G06F 3/0412 |
| | | | | 345/175 |
| 2016/0372514 A1* | 12/2016 | Chang | ...................... | G09G 3/32 |
| 2018/0068986 A1* | 3/2018 | Yoo | ...................... | H01L 25/075 |
| 2018/0269191 A1* | 9/2018 | England | ................ | H01L 27/156 |
| 2019/0360673 A1* | 11/2019 | Seo | ...................... | H01L 23/492 |

FOREIGN PATENT DOCUMENTS

| KR | 10-2006-0061479 A | 6/2006 |
|---|---|---|
| KR | 10-0875961 B1 | 12/2008 |
| KR | 10-2013-0137985 A | 12/2013 |

\* cited by examiner

MICRO LED MODULE WITH FLEXIBLE MULTILAYER CIRCUIT SUBSTRATE

BACKGROUND OF THE INVENTION

1. Field of the Invention

The present invention relates to a flexible display that uses LED modules including multilayer flexible circuit boards and can be attached to an outer panel of a vehicle. The present invention also relates to a system for extending a driver's view using a micro-LED display panel.

2. Description of the Related Art

Generally, when a flexible printed circuit board (FPCB) is designed in a multilayer structure, via holes are formed for electrical interconnection between the layers. The formation of via holes is usually accomplished by a mechanical process using a suitable tool, such as a punch or drill, or chemical etching.

Microvia holes having a size of 50 to 100 micrometers are formed using a $CO_2$ laser or chemical etching of polyimide. Processes based on plasma or chemical etching are very advantageous in terms of cost competitiveness because of their ability to form a number of holes per unit area but are applied only to limited materials.

According to conventional processes, holes not larger than 100 micrometers are processed by CNC drilling or die punching. As the pitch of interconnection circuits decreases, techniques for processing 50 μm via holes are also required. Under these circumstances, techniques for processing micro-holes smaller than 20 micrometers using an excimer or YAG laser are currently being developed.

FIG. 1 illustrates via holes V1 and V2 formed by a conventional process. As illustrated in FIG. 1, each of the via holes V1 and V2 has a truncated conical shape in which the area G1 of the processed surface side is larger and the area G2 of the opposite side is smaller.

When a plurality of micro-LED chips are mounted on an FPCB to construct a micro-LED module, the truncated conical shape of via holes presents the following disadvantages.

The micro-LED chips may be flip type LED chips or vertical LED chips. In this case, one side of each of the micro-LED chips is usually 100 micrometers or less in length. Thus, the width or length of each electrode pad of the micro-LED chip is limited to 80 micrometers or less. When one side of the electrode pad is 90 micrometers or less in length, the interval between the electrode pads should be not greater than 80 micrometers. It is thus necessary to form bumps at an interval of 80 micrometers or less. To this end, the diameter of the via holes is, as a rule, limited to 70 micrometers or less. To overcome this disadvantage, a plurality of layers are used to construct the micro-LED module. When the truncated conical via holes are used for electrical connection between the layers, the wider portions of the via holes are causes of interference, which should also be considered upon vertical interconnection. The wider surface sides make the interval between the via holes at the surface sides narrower, which increases the possibility of short-circuits between the adjacent electrodes.

An advertisement or notice is usually posted on an outer panel of a vehicle using a magnet. In this case, however, the advertisement or notice is likely to fall off during long-term use or while driving. Alternatively, painting or wrapping may be used to post an advertisement or notice on an outer panel of a vehicle. In this case, however, the advertisement or notice may be partially or wholly discolored or faded. Further, the advertisement or notice is not easy to frequently replace (for example, in minutes or seconds) and is impossible to display in the form of moving pictures or images. Alternatively, an adhesive tape may be used to post an advertisement or notice on an outer panel of a vehicle. In this case, the advertisement or notice is not easy to frequently replace (for example, in minutes or seconds) and is impossible to display in the form of moving pictures or images.

For display of an advertisement or notice in the form of moving pictures or images, an LCD, OLED or LED as a display is held or attached to an outer panel of a vehicle. However, this display is not easy to mount on the vehicle. Once mounted, the display is likely to fall off during long-term use or while driving. Many practical difficulties are encountered in the use of the display due to narrow roadways and the height of the display.

As shown in FIG. 21, a vehicle includes pillars supporting a roof 3. These pillars include an A-pillar 2, a B-pillar 4, and a C-pillar 6.

The A-pillar 2 together with a windscreen 5 is located in the front vision of the driver to support the roof 3 and the front window 5. Particularly, when the vehicle turns toward the driver' seat, the A-pillar 2 close to the driver blocks a portion of the driver's view, posing a great danger while driving. FIG. 22 shows an interior portion of the vehicle where the A-pillar 2 blocks the driver's vision.

Referring again to FIG. 21, the B-pillar 4 partially blocks the field of view of a person sitting in the back seat of the vehicle but does not impede the driver's view when the driver looks out of a side window 7. The C-pillar 6 supports a rear window 8 as well as the roof 3. When the driver moves forward while keeping his/her eyes forward, the C-pillar 6 does not impede the driver's view. However, when the driver moves the vehicle forward while checking out his/her back through a rearview mirror or reverses the vehicle while turning his/her head, the C-pillar 6 may block the driver's vision.

Numerous attempts have been made to solve the problems encountered when a driver's vision is obstructed by pillars. One of these attempts is to display external images blocked by an A-pillar of a vehicle on an interior part of the vehicle. According to this attempt, the driver's confusion is avoided by displaying images almost identical to external images visible to the driver when the pillar (particularly, the A-pillar) is not provided, on the inner surface of the pillar. However, a conventional display suffers from difficulty in displaying external scenes with high quality and has a fundamental limitation in mounting on a curved pillar due to its inherent stiffness. Further, even when the display provides external images to the inner surface of an A-pillar, images recognized by the driver may greatly vary depending on the distance between the A-pillar and the driver and the width of the A-pillar, increasing the risk that the driver may look at distorted images.

SUMMARY OF THE INVENTION

One object of the present invention is to provide micro-LED modules that use multilayer flexible circuit boards having via holes capable of ensuring high efficiency of vertical interconnection while preventing short-circuits.

A further object of the present invention is to provide a flexible display that is attached to an outer panel of a vehicle and can provide a solution to problems (e.g., falling off or discoloration caused by external environmental factors)

encountered in conventional methods for posting an advertisement or notice on an outer panel of a vehicle using a magnet or by painting or wrapping.

Another object of the present invention is to provide a system for extending a driver's view that uses a micro-LED display panel installed along the inner surface of a pillar to provide the driver with images very similar to external images.

First Embodiment

A micro-LED module according to one aspect of the present invention includes: a flexible circuit board including a first conductive pattern, a second conductive pattern, and a third conductive pattern; and a plurality of LED pixels, each of which includes a first micro-LED chip electrically connected to the upper side of the first conductive pattern and having at least one side whose length is 100 μm or less, a second micro-LED chip electrically connected to the upper side of the second conductive pattern and having at least one side whose length is 100 μm or less, and a third micro-LED chip electrically connected to the upper side of the third conductive pattern and having at least one side whose length is 100 μm or less, wherein each of the first micro-LED chip, the second micro-LED chip, and the third micro-LED chip includes at least one electrode pad having a width of 80 μm or less, the flexible circuit board includes a first flexible insulating film formed on the upper surface of the first conductive pattern and a second flexible insulating film formed in contact with the lower surface of the first conductive pattern and the upper surface of the second conductive pattern, and the first flexible insulating film includes a first via hole having the same cross section from the upper to the lower surface and a connection pad formed in the first via hole and electrically connected to the first conductive pattern.

According to one embodiment, the flexible circuit board includes at least one electrode pattern corresponding to each of the electrode pads of the first micro-LED chip, the second micro-LED chip, and the third micro-LED chip.

According to one embodiment, the electrode pattern is electrically connected to the connection pad of the flexible circuit board.

According to one embodiment, the second flexible insulating film includes a second via hole having the same cross section from the upper to the lower surface and the first via hole and the second via hole are continuously formed.

According to one embodiment, the first via hole is cylindrical in shape.

According to one embodiment, the first flexible insulating film is stacked on and bonded to the second flexible insulating film such that the first connection pad is connected to a corresponding area of the second conductive pattern.

According to one embodiment, the first via hole and the second via hole have the same cross-sectional area and shape.

According to one embodiment, the first flexible insulating film is formed by subjecting a flexible substrate to photolithography to form the first via hole and filling a metal in the first via hole to form the connection pad.

A micro-LED module according to a further aspect of the present invention includes: a flexible circuit board including a first conductive pattern, a second conductive pattern, a third conductive pattern, . . . , and an $n^{th}$ conductive pattern; and a plurality of LED pixels, each of which includes a first micro-LED chip electrically connected to the upper side of the first conductive pattern and having at least one side whose length is 100 μm or less, a second micro-LED chip electrically connected to the upper side of the second conductive pattern and having at least one side whose length is 100 μm or less, and a third micro-LED chip electrically connected to the upper side of the third conductive pattern and having at least one side whose length is 100 μm or less, wherein each of the first micro-LED chip, the second micro-LED chip, and the third micro-LED chip includes at least one electrode pad having a width of 80 μm or less, and the flexible circuit board further includes a first flexible insulating film formed on the upper surface of the first conductive pattern, a second flexible insulating film formed between the first conductive pattern and the second conductive pattern, and an $n^{th}$ flexible insulating film formed between the $(n-1)^{th}$ conductive pattern and the $n^{th}$ conductive pattern, via holes having the same cross section from the upper surface of the first flexible insulating film to the lower surface of the $n^{th}$ flexible insulating film, and connection pads formed in the via holes and electrically connected to the first conductive pattern.

A micro-LED module according to another aspect of the present invention includes: a flexible circuit board; and a first LED pixel and a second LED pixel mounted on the flexible circuit board and each including a first micro-LED chip, a second micro-LED chip, and a third micro-LED chip, each of which has at least one side whose length is 100 μm or less, wherein each of the first micro-LED chip, the second micro-LED chip, and the third micro-LED chip is of a flip-chip type including one or more first and second electrode pads, each of which has a width of 80 μm or less, on the surface facing the flexible circuit board, the flexible circuit board includes a first flexible insulating film including electrode patterns including a first electrode pattern and a second electrode pattern formed on the upper surface thereof and connected to the electrode pads through solder bumps having a diameter of 80 μm or less, a second flexible insulating film connected to the bottom of the first flexible insulating film through first conductive patterns, a third flexible insulating film connected to the bottom of the second flexible insulating film through second conductive patterns, a fourth flexible insulating film connected to the bottom of the third flexible insulating film through third conductive patterns, and a fifth flexible insulating film connected to the bottom of the fourth flexible insulating film through fourth conductive patterns, the first flexible insulating film includes a first interconnection including connection pads through which the first electrode pattern corresponding to the first electrode pad of the first micro-LED chip of the first LED pixel and the first electrode pattern corresponding to the first electrode pad of the second micro-LED chip are connected to the first conductive pattern, the first flexible insulating film and the second flexible insulating film include a second interconnection including connection pads through which the first electrode pattern corresponding to the first electrode pad of the second micro-LED chip of the first LED pixel and the first electrode pattern corresponding to the first electrode pad of the second micro-LED chip are connected to the second conductive pattern, the first flexible insulating film, the second flexible insulating film, and the flexible insulating film include a third interconnection including connection pads through which the first electrode pattern corresponding to the first electrode pad of the third micro-LED chip of the first LED pixel and the first electrode pattern corresponding to the first electrode pad of the third micro-LED chip are connected to the third conductive pattern, and the connection pads of the first interconnection, the connection pads of the second interconnection, and the connection pads of the third interconnection have the same cross-sectional area and shape from the upper to the lower end.

According to one embodiment, each of the connection pads of the first interconnection, the connection pads of the second interconnection, and the connection pads of the third interconnection is preferably formed in a cylindrical via hole.

According to one embodiment, the first flexible insulating film, the second flexible insulating film, the third flexible insulating film, and the fourth flexible insulating film include a fourth interconnection including connection pads through which the second electrode patterns corresponding to the second electrode pads of the first micro-LED chip, the second micro-LED chip, and the third micro-LED chip of the first LED pixel or the second LED pixel are connected to the fourth conductive pattern, and the connection pads of the fourth interconnection have the same cross-sectional area and shape from the upper to the lower end.

According to one embodiment, each of the connection pads of the fourth interconnection is preferably formed in a cylindrical via hole.

Second Embodiment

A vehicle-mounted flexible display according to one aspect of the present invention includes a micro-LED panel including a plurality of micro-LED modules arranged adjacent to one another and a clear coating layer arranged over the micro-LED panel wherein each of the plurality of micro-LED modules includes a plurality of pixels including a plurality of micro-LED chips and an FPCB unit on which the plurality of pixels are arrayed in a matrix, and the FPCB unit includes a mounting surface attachable to an outer panel of a vehicle over the entire area thereof.

According to one embodiment, portions of the bottom of the clear coating layer are in contact with the FPCB units of the plurality of micro-LED modules.

According to one embodiment, the clear coating layer reflects UV light.

According to one embodiment, each of the plurality of pixels includes a first micro-LED chip, a second micro-LED chip, and a third micro-LED chip.

According to one embodiment, the first micro-LED chip, the second micro-LED chip, and the third micro-LED chip emit light of the same wavelength band.

According to one embodiment, the first micro-LED chip is covered with a first wavelength converting material capable of converting the wavelength of light emitted from the first micro-LED chip into a longer wavelength.

According to one embodiment, the third micro-LED chip of each pixel is covered with a light converting material.

According to one embodiment, the second micro-LED chip is covered with a second wavelength converting material capable of converting the wavelength of light emitted from the second micro-LED chip into a longer wavelength but not longer wavelength than the wavelength converted by the first wavelength converting material.

According to one embodiment, the first micro-LED chip and the third micro-LED chip emit light of the same wavelength band and the second micro-LED chip emits light whose wavelength is longer than that of light emitted from the first micro-LED chip.

According to one embodiment, the first micro-LED chip is covered with a first wavelength converting material capable of converting the wavelength of light emitted from the first micro-LED chip into a longer wavelength than the wavelength of light emitted from the second micro-LED chip.

According to one embodiment, each of the second micro-LED chip and the third micro-LED chip is covered with a light transmitting material.

According to one embodiment, the outer panel of the vehicle is selected from the side, top, rear, and front panels of the vehicle and the FPCB is attached to a portion or the entire area of at least one outer panel selected from the side, top, rear, and front panels of the vehicle.

A flexible display according to a further aspect of the present invention is attached to an outer panel of a vehicle and includes: an FPCB having a mounting surface attachable to the outer panel of the vehicle over the entire area thereof; a plurality of pixels arranged in a matrix on the FPCB and each including a plurality of micro-LED chips; and a clear coating layer arranged over the plurality of pixels, wherein portions of the bottom of the clear coating layer are in contact with the FPCB.

Third Embodiment

According to one aspect of the present invention, there is provided a system for extending a driver's view, including: an image acquisition unit acquiring images outside a vehicle that are blocked by an A-pillar; a micro-LED display panel installed along the inner surface of the pillar; and an image processing unit processing the images outside the vehicle that are acquired by the image acquisition unit and providing the processed images to the micro-LED display panel, wherein the LED display panel includes a flexible substrate deformable along the shape of the inner surface of the pillar and micro-LED chips mounted on the flexible substrate, and a single image is created through the micro-LED display panel and glass adjacent to the pillar. The term "single image" can be interpreted to mean one merged image of a partial image displayed through the micro-LED display panel and the other partial image displayed through the adjacent glass.

According to one embodiment, the micro-LED chips include red LED chips, green LED chips, and blue LED chips adjacent to one another to constitute micro-LED pixels.

According to one embodiment, the micro-LED chips may be wireless LED chips.

According to one embodiment, the micro-LED display panel further includes a protective layer surrounding the micro-LED chips.

According to one embodiment, the micro-LED display panel further includes a protective layer surrounding the micro-LED pixels.

According to one embodiment, the inner surface of the pillar includes a curved plane and the flexible substrate is curved corresponding to the curved plane.

According to one embodiment, the image acquisition unit includes an angle-adjustable camera.

According to one embodiment, the image acquisition unit further includes an actuator placed in the center fascia, the dashboard, the steering wheel, the inner surface of a door or the inner surface of a pillar of the vehicle to adjust the angle of the camera.

According to one embodiment, the pillar is an A-pillar located beside the driver's seat and the micro-LED display panel is installed on the inner surface of the A-pillar.

According to one embodiment, the image acquisition unit includes a plurality of cameras, one of the plurality of cameras is selected by a controller, and the images outside the vehicle acquired by the selected camera are output through the micro-LED display panel.

According to one embodiment, the pillar is an A-pillar located beside the passenger seat and the micro-LED display panel is installed on the inner surface of the A-pillar.

According to one embodiment, the image acquisition unit includes a first camera acquiring images outside the vehicle when viewed by the driver and a second camera acquiring images outside the vehicle when viewed by the passenger, and the controller outputs the images acquired by one of the first camera and the second camera through the micro-LED display panel.

According to one embodiment, the pillar is a C-pillar and the micro-LED display panel is installed on the inner surface of the C-pillar.

According to one embodiment, the image acquisition unit includes a first camera acquiring images outside the vehicle when viewed by a person in the back seat and a second camera acquiring images outside the vehicle when viewed by the driver, and the controller outputs the images acquired by one of the first camera and the second camera through the micro-LED display panel.

[Effects of the First Embodiment]

Each of the micro-LED modules according to the present invention is based on a multilayer flexible circuit board consisting of layers stacked on one another having via holes (more specifically, cylindrical via holes) whose cross section is constant along the depth direction from one end to the other end. According to the present invention, the formation of the via holes can ensure high efficiency of vertical interconnection. In addition, sufficient distances between the via holes are ensured so that short-circuits can be prevented.

[Effects of the Second Embodiment]

The flexible display of the present invention is attached to an outer panel of a vehicle and can provide a solution to problems (e.g., falling off or discoloration caused by external environmental factors) encountered in conventional methods for posting an advertisement or notice on an outer panel of a vehicle using a magnet or by painting or wrapping.

[Effects of the Third Embodiment]

The system of the present invention can provide a solution to problems caused by a pillar blocking a driver's vision. The system of the present invention can display images outside a vehicle that are blocked by a pillar, on the inner surface of the pillar, thus being effective in avoiding the driver's confusion. In addition, the system of the present invention uses a micro-LED display panel including micro-LED chips to provide the driver and passengers with images with very similar quality to external images. Furthermore, the use of a flexible substrate deformable along the shape of the inner surface of a pillar and micro-LED chips arranged at micro-scale intervals on the flexible substrate in the micro-LED display panel enables the installation of the micro-LED display panel along the shape of the inner surface of the pillar irrespective of whether the inner surface of the pillar is complex in shape.

BRIEF DESCRIPTION OF THE DRAWINGS

[First embodiment]

[Second embodiment]

Figure 10:
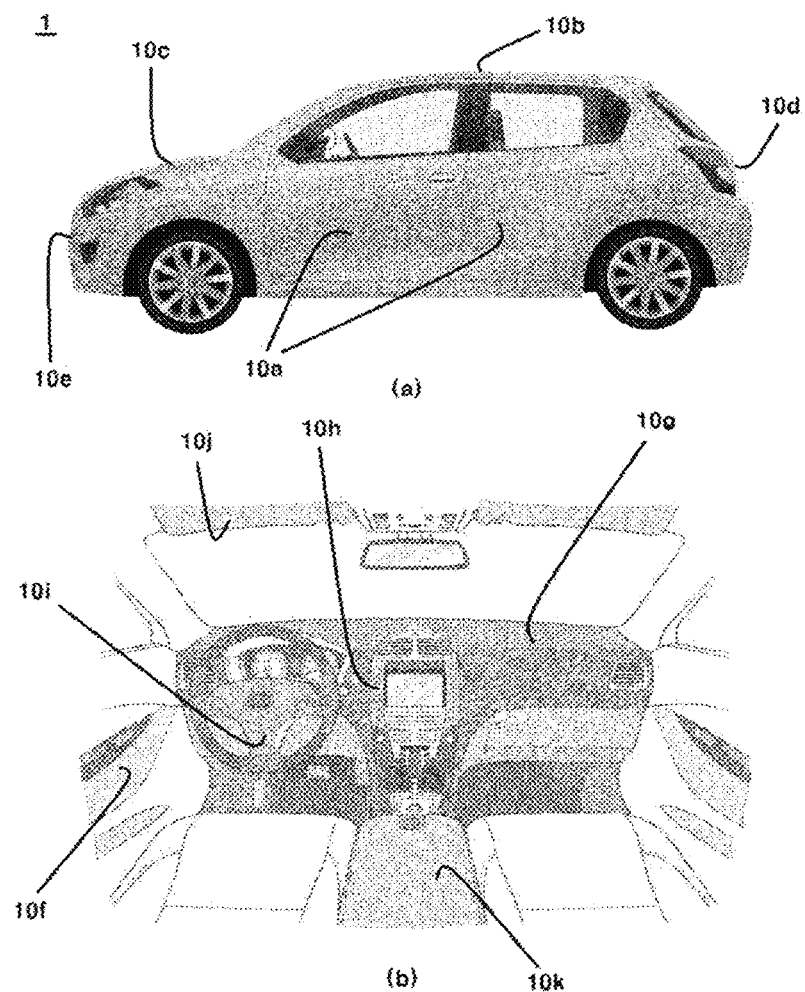

FIG. 10 shows the positions of major external and internal parts of a vehicle to which a vehicle-mounted flexible display according to one embodiment of the present invention is applied.

Figure 11:
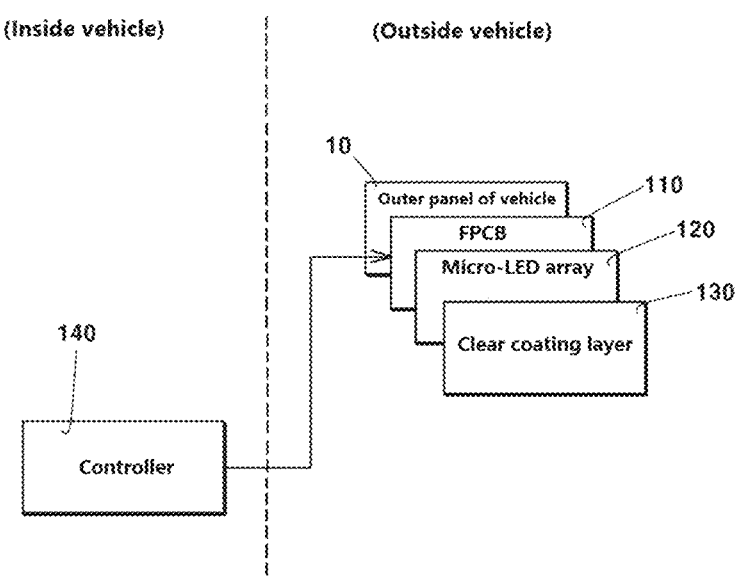

FIG. 11 is a block diagram for explaining the concept of a vehicle-mounted flexible display according to one embodiment of the present invention.

Figure 12:
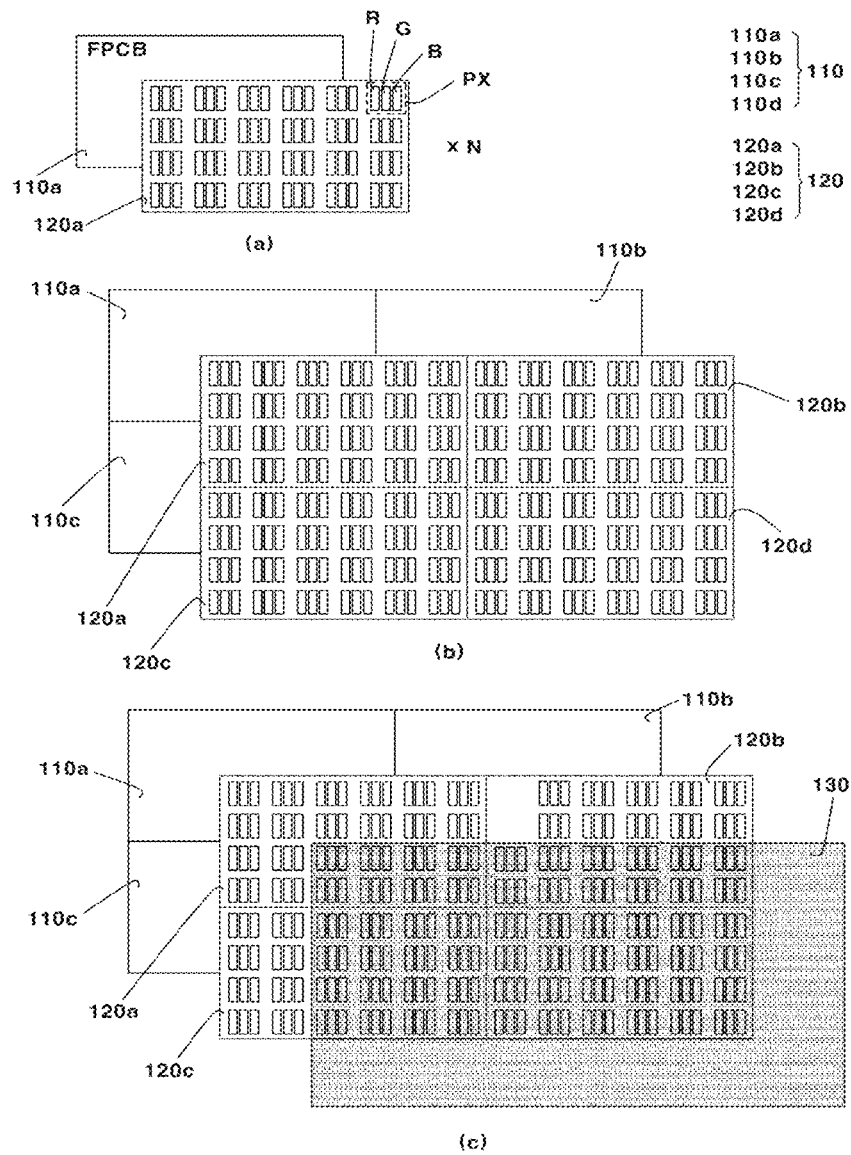

FIG. 12 illustrates a vehicle-mounted flexible display according to one embodiment of the present invention.

Figure 13:
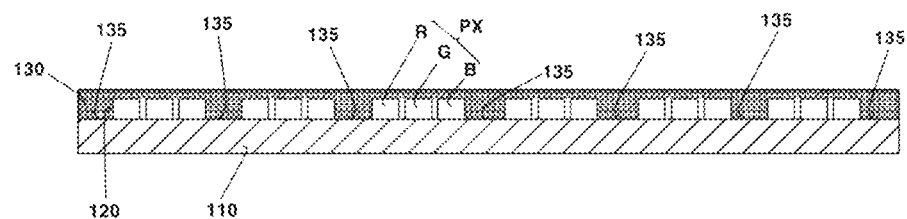

FIG. 13 is a cross-sectional view illustrating a vehicle-mounted flexible display according to one embodiment of the present invention.

FIGS. 14 to 17 show vehicle-mounted flexible displays according to exemplary embodiments of the present invention that are applied to various outer panels of vehicles.

Figure 18:
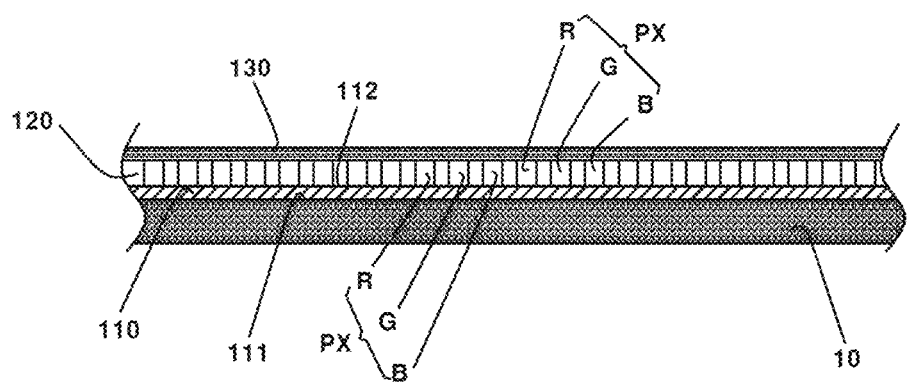

FIG. 18 is an exemplary cross-sectional view illustrating a state in which a vehicle-mounted flexible display according to one embodiment of the present invention is attached to an outer panel of a vehicle.

Figure 19:
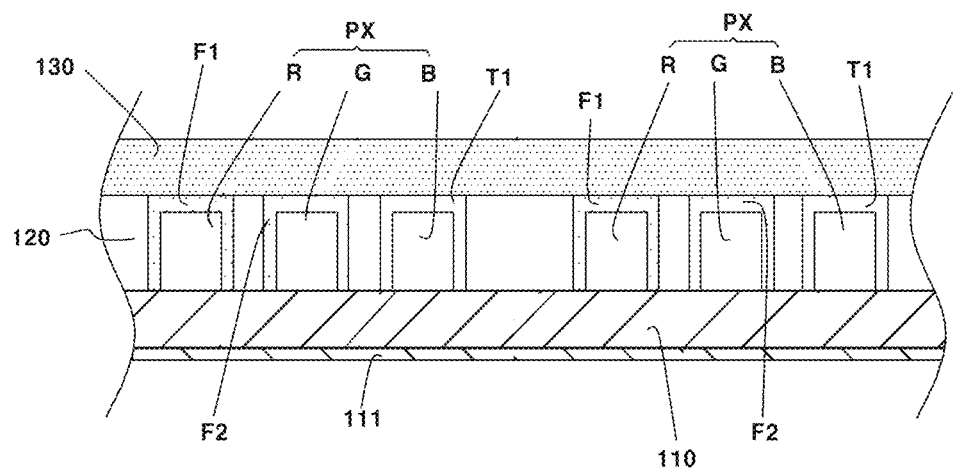
Figure 20:
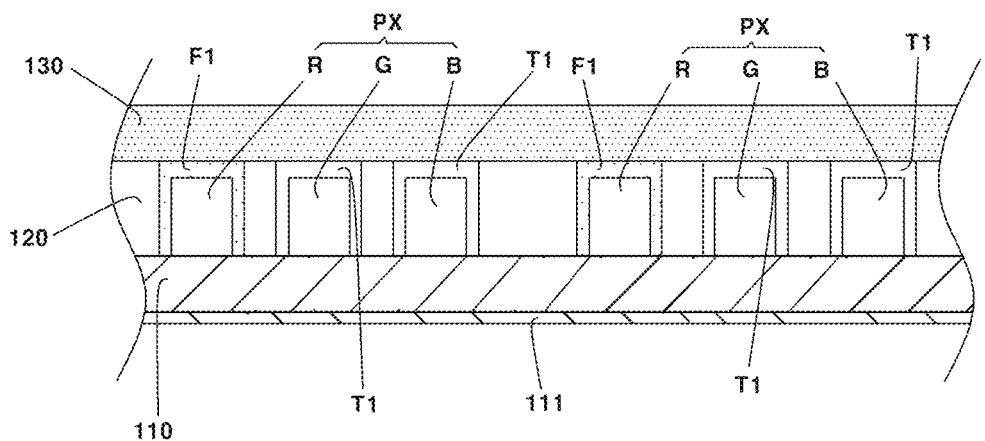

FIGS. 19 and 20 are cross-sectional views illustrating vehicle-mounted flexible displays according to exemplary embodiments of the present invention.

[Third embodiment]

Figure 21:
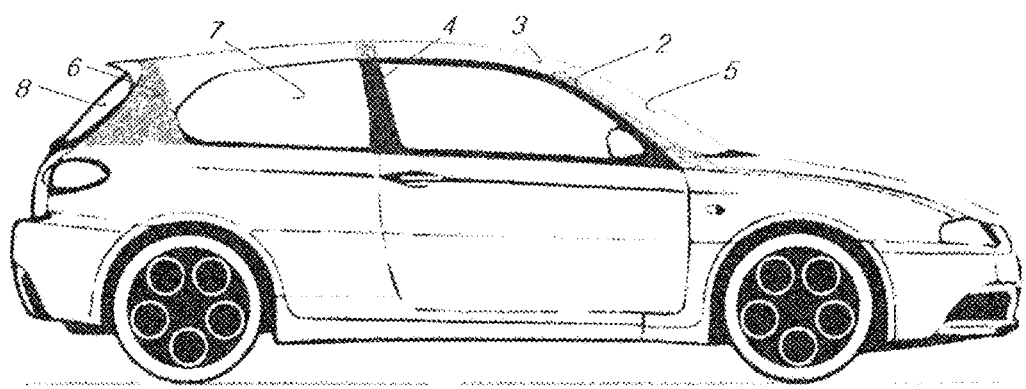

FIG. 21 shows a side view of a general vehicle for explaining the terms "A-pillar", "B-pillar", and "C-pillar".

Figure 22:
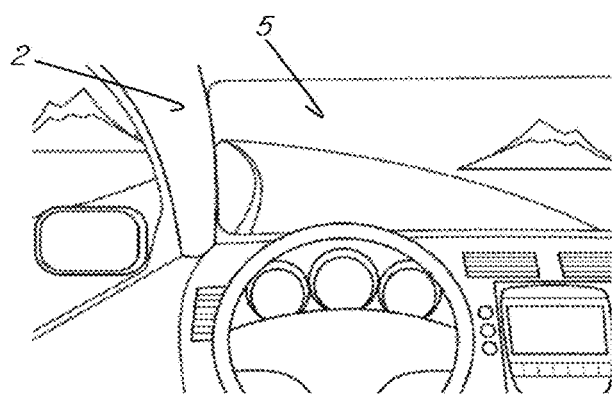

FIG. 22 shows an interior portion of a vehicle whose driver's vision is blocked by an A-pillar.

Figure 23:
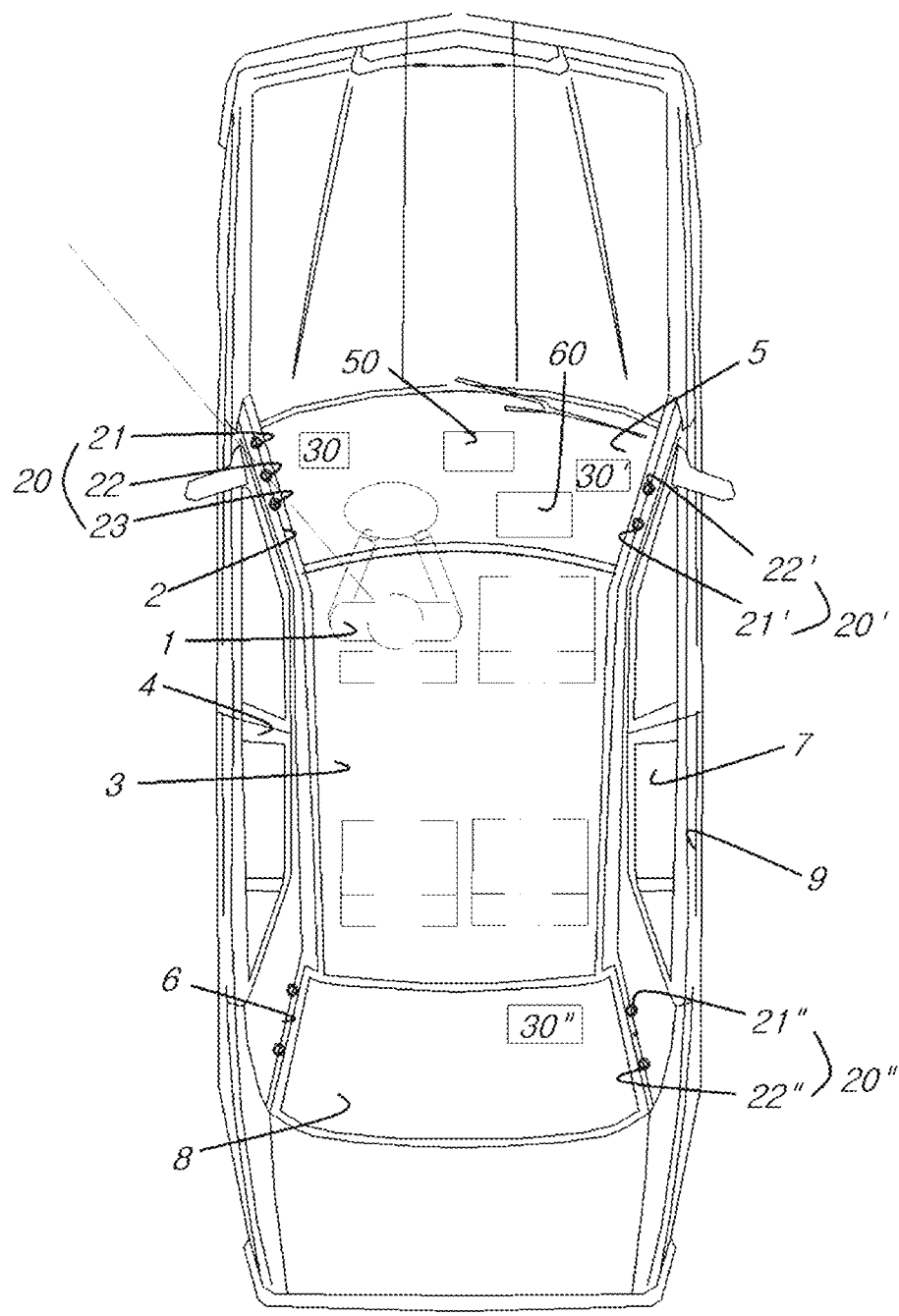

FIG. 23 is a plan view of a vehicle for explaining a system for extending a driver's view according to one embodiment of the present invention.

Figure 24:
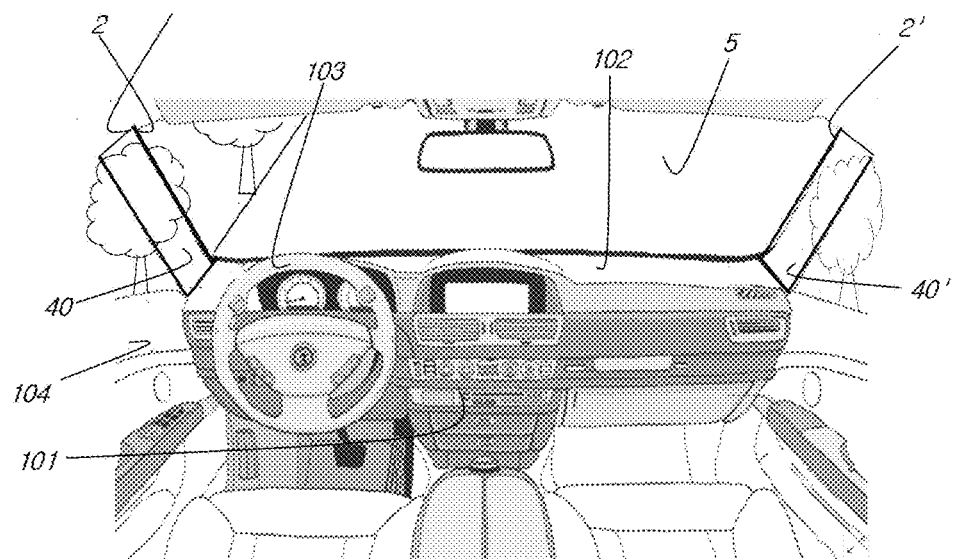

FIG. 24 is a view for explaining a system for extending a driver's view including micro-LED display panels applied to an A-pillar.

Figure 25:
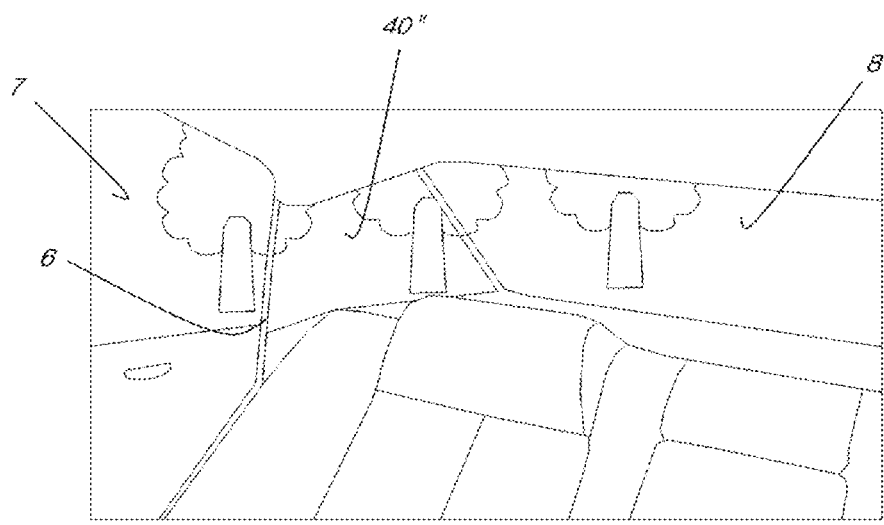

FIG. 25 is a view for explaining a system for extending a driver's view including a micro-LED display panel applied to a C-pillar.

Figure 26:
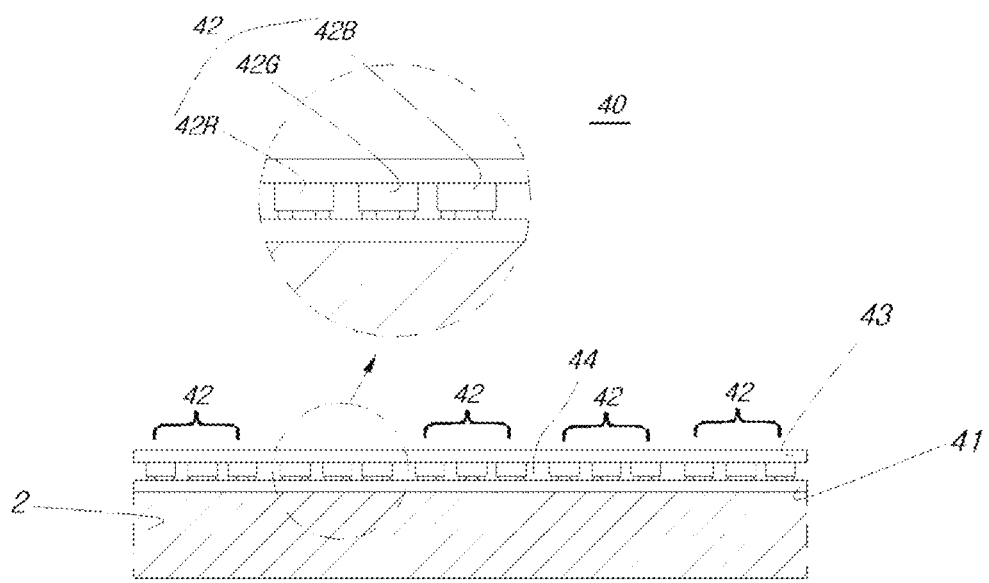

FIG. 26 is a partial cross-sectional view illustrating a micro-LED display panel.

Figure 27:
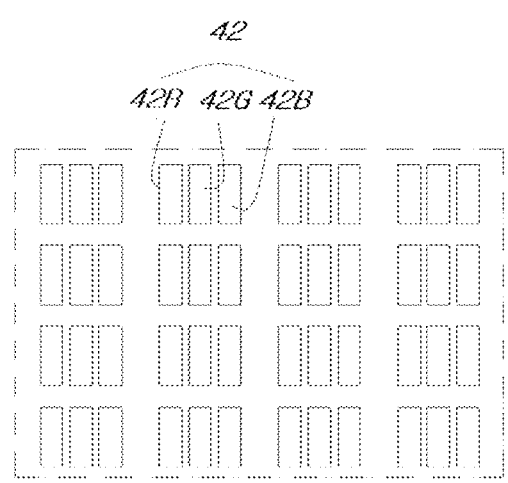

FIG. 27 is a partial plan view illustrating a micro-LED display panel.

DETAILED DESCRIPTION OF THE INVENTION

First Embodiment

Figure 1:
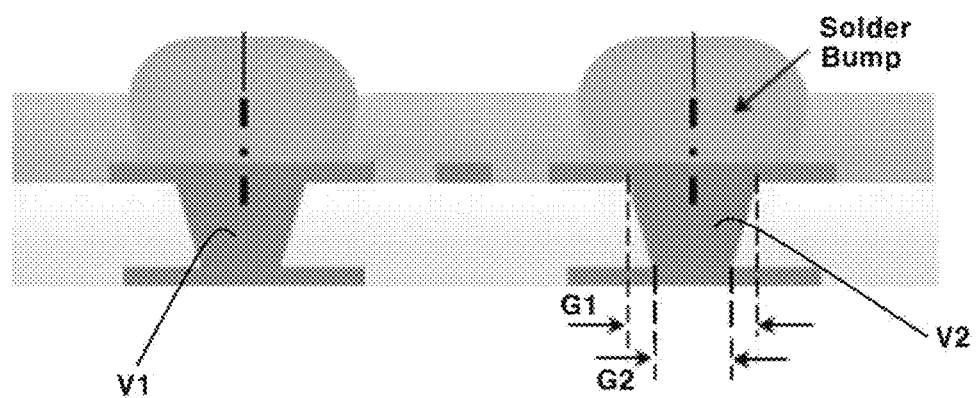
FIG. 1 illustrates via holes formed by a conventional process.
Figure 2:
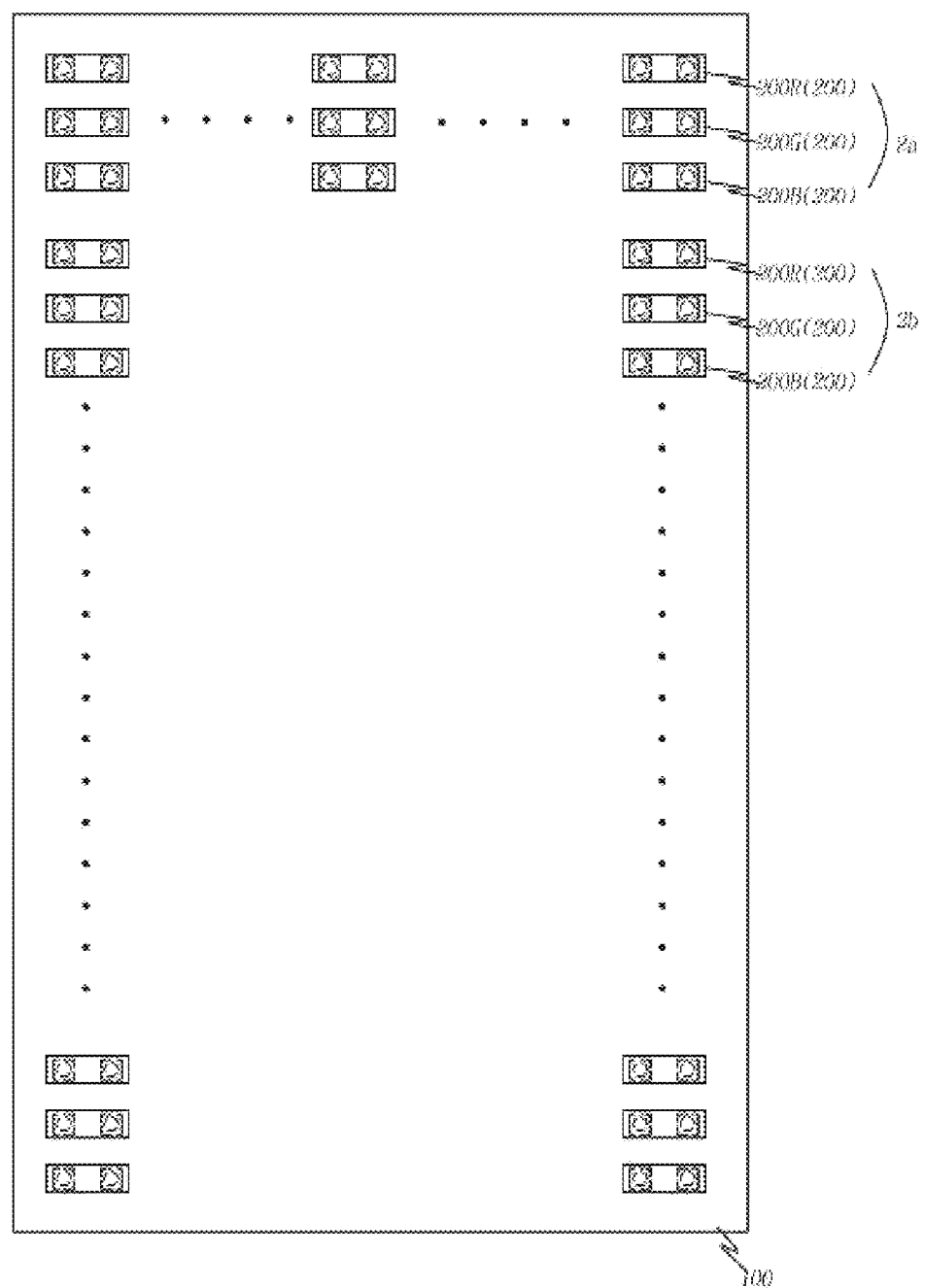
FIG. 2 is a plan view illustrating a micro-LED module according to one embodiment of the present invention.
Figure 3:
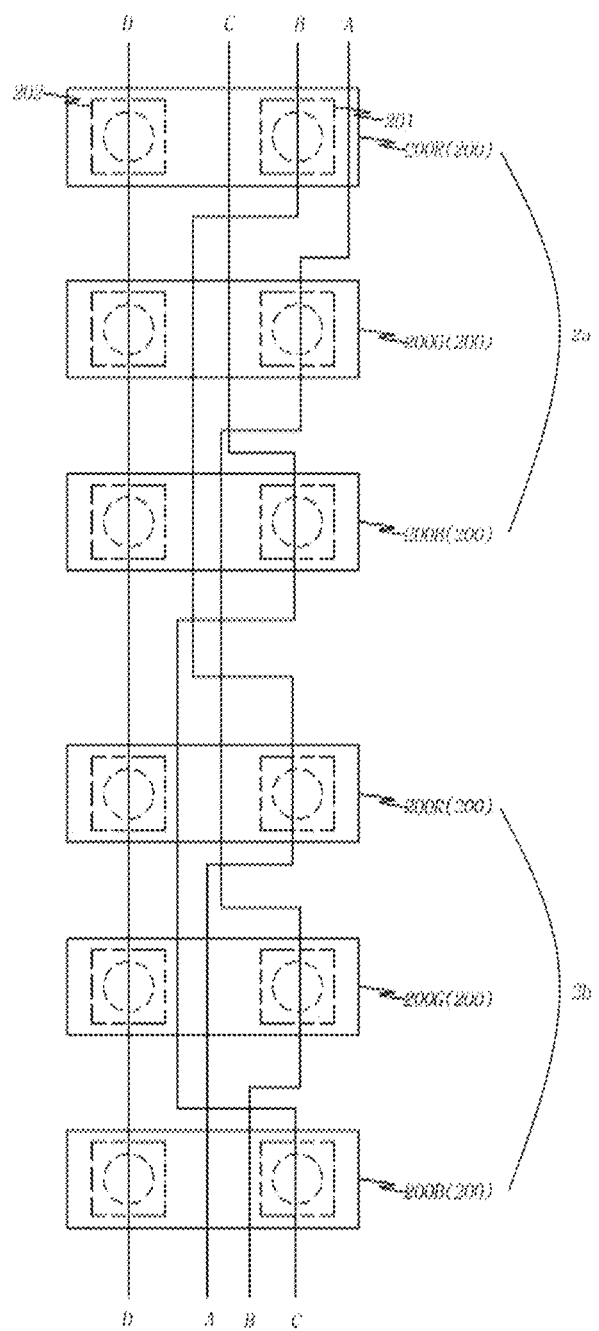
FIG. 3 is a partially exploded plan view of FIG. 2 in which invisible electrode pads and solders are shown by hidden lines.
Figure 4:
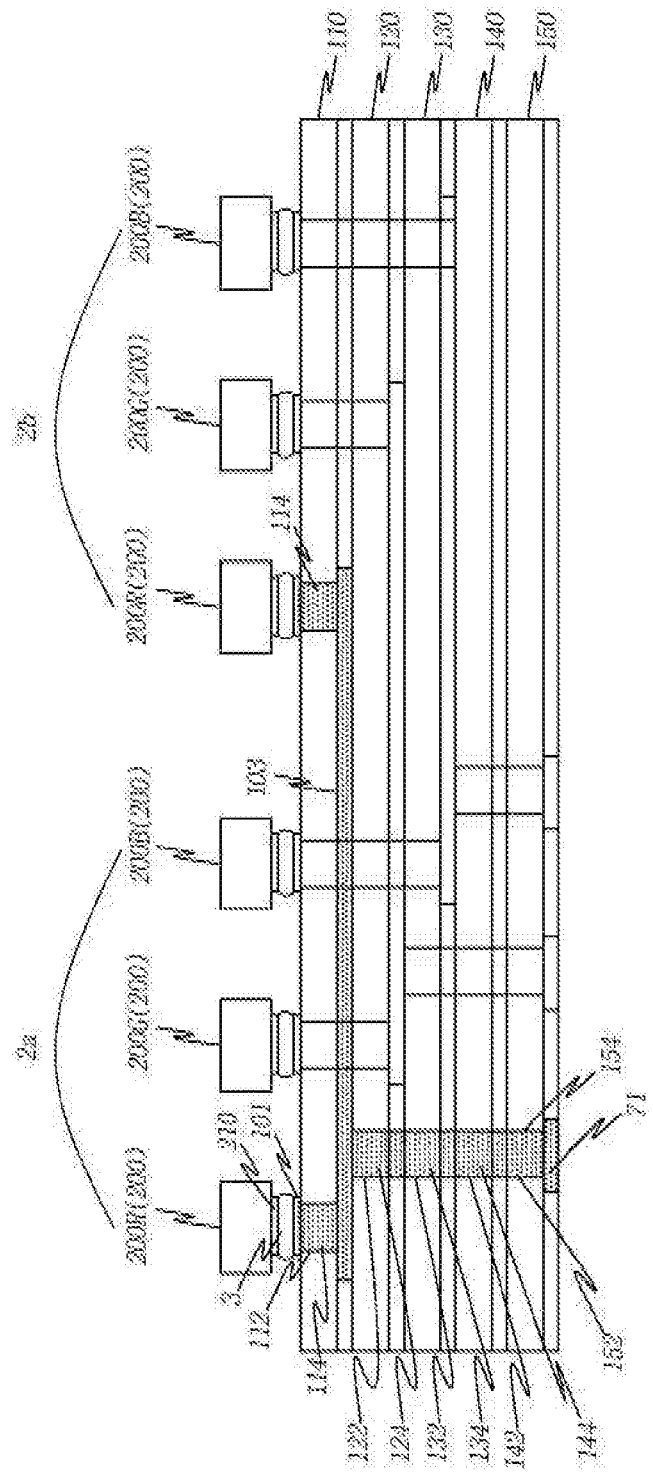
FIG. 4 is a cross-sectional view taken along line A-A of FIG. 3.
Figure 5:
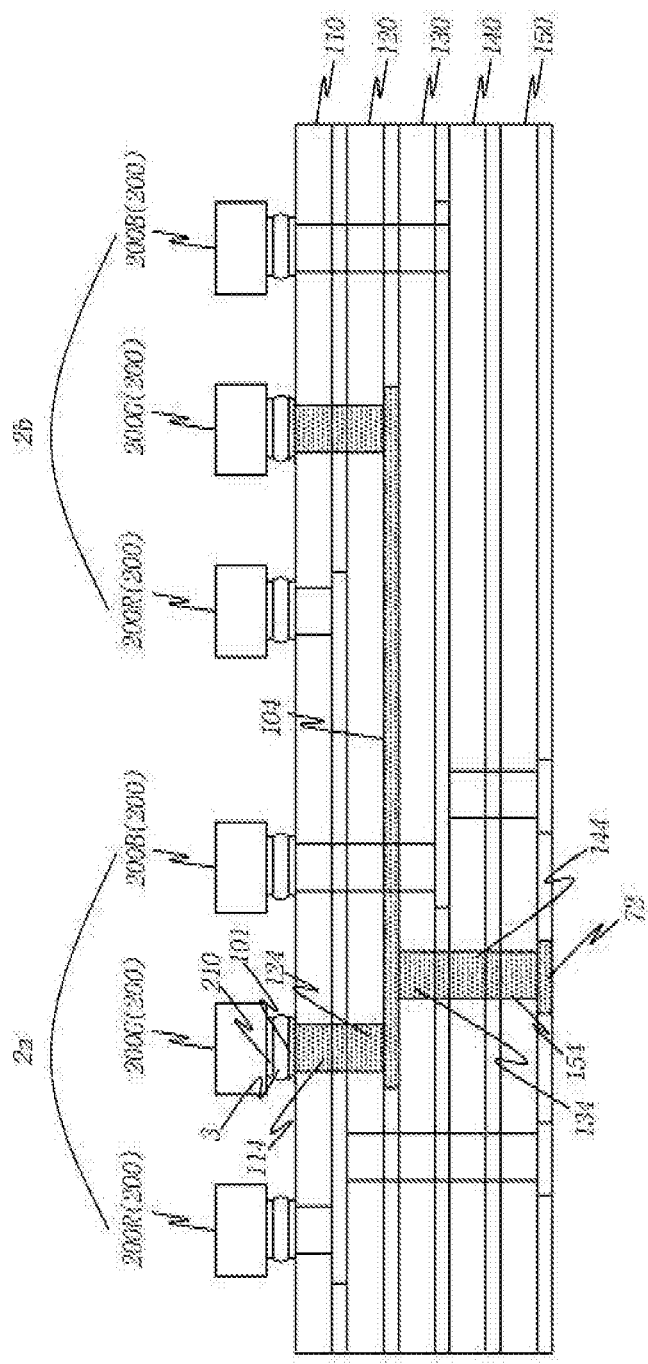
FIG. 5 is a cross-sectional view taken along line B-B of FIG. 3.
Figure 6:
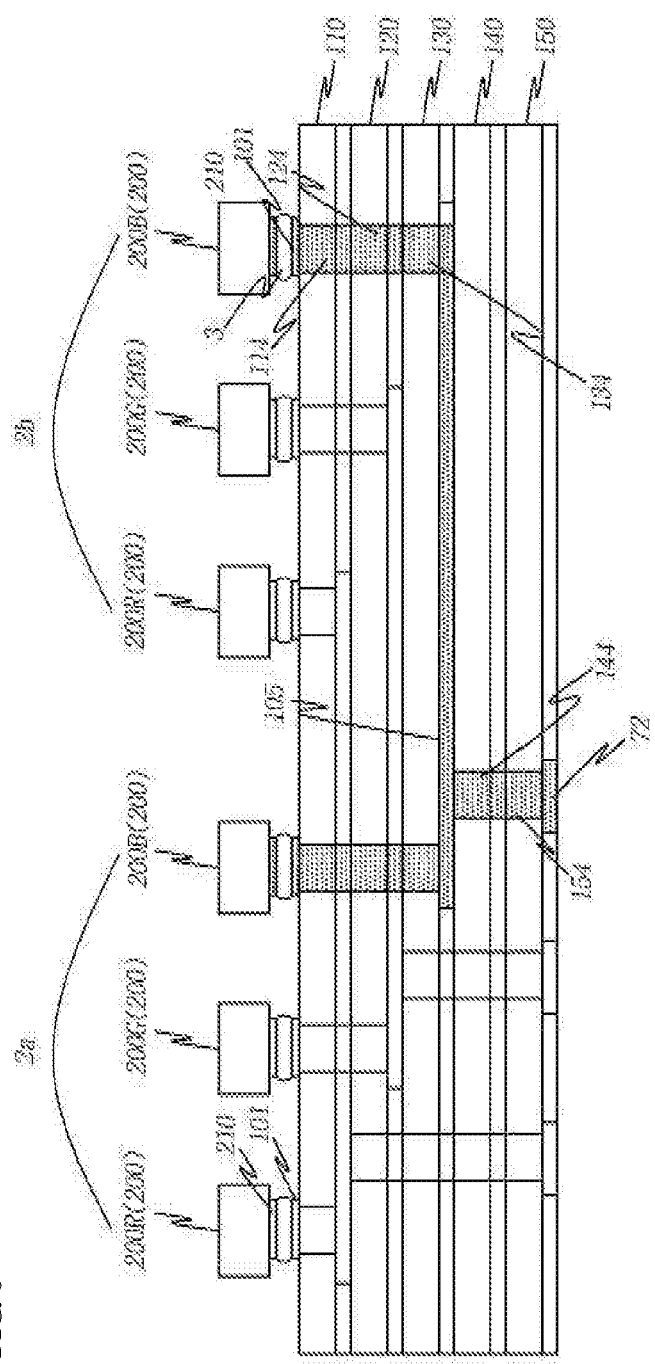
FIG. 6 is a cross-sectional view taken along line C-C of FIG. 3.

FIG. 2 is a plan view illustrating a micro-LED module according to one embodiment of the present invention and FIG. 3 is a partially exploded plan view of FIG. 2 in which invisible electrode pads and solders are shown by hidden lines.

Referring to FIGS. 2 and 3, the LED module includes a flexible circuit board 100 and a plurality of LED pixels 2a and 2b arrayed in a matrix on the flexible circuit board 100. Each of the LED pixels 2a and 2b includes a first micro-LED chip 200R, a second micro-LED chip 200G, and a third micro-LED chip 200B emitting light of different wavelengths. The first, second, and third micro-LED chips 200R, 200G, and 200B are collectively denoted by reference numeral 200 and may be red, green, and blue micro-LED chips, respectively.

Each of the micro-LED chips 200 is of a flip-chip type having at least one side whose length is 100 µm or less. More specifically, each of the micro-LED chips 200 includes an upper surface and a lower surface, each of which has a short side of 200 µm and a long side of 300 µm. Thus, each of the micro-LED chips 200 includes electrode pads 210 and 220, each of which has one side whose length (i.e. width) is 80 µm or less. The electrode pads 210 and 220 are arranged at intervals of approximately 80 µm or less corresponding to the length. The flexible circuit board 100 is adapted to the intervals (≤–80 µm) between the electrodes and the diameter (≤–80 µm) of solder bumps.

FIGS. 4 to 7 illustrate cross-sectional views taken along lines A-A, B-B, C-C, and D-D of FIG. 3, respectively.

Only two of the plurality of LED pixels 2a and 2b illustrated in FIG. 2 are enlarged in FIGS. 3 to 7. As mentioned above, the first micro-LED chips 200R emit red light, the second micro-LED chips 200G emit green light, and the third micro-LED chips 200B emit blue light.

The first micro-LED chip 200R, the second micro-LED chip 200G, and the third micro-LED chip 200B of each of the first LED pixel 2a and the second LED pixel 2b are mounted on the flexible circuit board 100. The flexible circuit board 100 has a multilayer structure in which a plurality of flexible insulating films 110, 120, 130, 140, and 150 formed with conductive patterns are stacked on one another. Due to the flexibility of the flexible insulating films, the size of the micro-LED chips, and the intervals between the micro-LED chips, the shape of the flexible circuit board 100 may vary depending on where the micro-LED module is placed.

Electrode patterns including first electrode patterns 101 and second electrode patterns 102 are formed on the upper surface of the first flexible insulating film 110. The first electrode patterns 101 and the second electrode patterns 102 correspond to the first electrode pads 210 and the second electrode pads 220 of the micro-LED chips 200R, 200G, and 200B, respectively. Here, the electrode patterns include electrode patterns corresponding to the first micro-LED chips 200R, electrode patterns corresponding to the second micro-LED chips 200G, and electrode patterns corresponding to the third micro-LED chips 200B.

A plurality of via holes 112 are formed so as to penetrate the first flexible insulating film 110. A first conductive connection pad 114 is formed in each of the via holes 112. The first conductive connection pad 114 may be completely or partially filled in each of the via holes 112. That is, the first conductive connection pad 114 may be solid or hollow.

The via holes 112 formed in the first flexible insulating film 110 are cylindrical holes whose cross-sectional area and shape are constant along the depth direction from one end to the other end.

Via holes formed in an insulating layer of a general PCB have a truncated conical shape with a wider upper end and a narrow lower end. The shape of the via holes makes it difficult to reduce the interval between electrode patterns corresponding to electrode pads of one micro-LED chip on the upper surface of a first flexible insulating film of a flexible circuit board. The shape of the via holes also make it difficult to reduce the intervals between adjacent micro-LED chips.

Failure to reduce the intervals between the electrode patterns indicates that the size of the micro-LED chip cannot be further reduced.

In contrast, according to the present invention, the via holes 112 formed in the first flexible insulating film 110 and the first conductive connection pads 114 formed in the via holes 112 are constant in cross-sectional area and shape from the upper end of the first flexible insulating film 110 connected to the electrode patterns 101 and 102 to the lower end of the first flexible insulating film 110. Thus, the intervals between the electrode patterns 101 and 102 can be reduced and the intervals between the micro-LED chips 200 can be further reduced.

Second, third, fourth, and fifth via holes 122, 132, 142, and 152 are formed in the second flexible insulating film 120, the third flexible insulating film 130, the fourth flexible insulating film 140, and the fifth flexible insulating film 150, respectively. Each of the second, third, fourth, and fifth via holes 122, 132, 142, and 152 is a cylindrical hole whose cross-sectional area and shape are constant from the upper to the lower end of the corresponding flexible insulating film. Second, third, fourth, and fifth conductive connection pads 124, 134, 144, and 154 are formed in the second, third, fourth, and fifth via holes 122, 132, 142, and 152, respectively. Each of the second, third, fourth, and fifth conductive connection pads 124, 134, 144, and 154 formed in the second, third, fourth, and fifth via holes 122, 132, 142, and 152 is also a cylindrical pad whose cross-section is constant from the upper to the lower end. This shape can minimize interference between the connection pads of the adjacent flexible insulating films stacked on one another. In a conventional micro-LED module employing truncated conical via holes and connection pads formed therein, many problems may be caused by unwanted interference between the connection pads.

A first conductive pattern 103 is formed in contact with the lower surface of the first flexible insulating film 110 and the upper surface of the second flexible insulating film 120 between the first and second flexible insulating films, a second conductive pattern 104 is formed in contact with the lower surface of the second flexible insulating film 120 and the upper surface of the third flexible insulating film 130, a third conductive pattern 105 is formed in contact with the lower surface of the third flexible insulating film 130 and the upper surface of the fourth flexible insulating film 140, and a fourth conductive pattern 106 is formed in contact with the lower surface of the fourth flexible insulating film 140 and the upper surface of the fifth flexible insulating film 150.

The first conductive pattern 103 connects at least one of the first conductive connection pads 114 to at least one of the second conductive connection pads 124 between the first flexible insulating film 110 and the second flexible insulating film 120. The second conductive pattern 104 connects at least one of the second conductive connection pads 124 to at least one of the third conductive connection pads 134 between the second flexible insulating film 120 and the third flexible insulating film 130. The third conductive pattern 105 connects at least one of the third conductive connection pads 134 to at least one of the fourth conductive connection pads 144 between the third flexible insulating film 130 and the fourth flexible insulating film 140. The fourth conductive pattern 106 connects at least one of the fourth conductive connection pads 144 to at least one of the fifth conductive connection pads 154 between the fourth flexible insulating film 140 and the fifth flexible insulating film 150. A conductive pattern is formed on the bottom surface of the fifth flexible insulating film 150 to constitute an input terminal and an output terminal. One or more flexible insulating films may be further provided below the fifth flexible insulating film 150. In this case, the additional flexible insulating films may have any of the structures described above.

In this embodiment, the first electrodes 210 of the first micro-LED chips 200R and 200R of the different LED pixels 2a and 2b are connected to the corresponding first electrode patterns 101 through solder bumps 3, the first electrode patterns 101 are connected to the corresponding first connection pads 114 connected to the first conductive pattern 103, and the first conductive pattern 103 is connected to an R terminal 71 as a portion of a fifth conductive pattern through an interconnection including the corresponding second connection pad 124, the corresponding third connection pad 134, the corresponding fourth connection pad 144, and the corresponding fifth connection pad 154. As a result, the first electrodes of the first micro-LED chips 200R and 200R of the different pixels 2a and 2b are electrically connected to each other (see FIG. 4).

The first electrodes 210 of the second micro-LED chips 200G and 200G of the different LED pixels 2a and 2b are connected to the corresponding first electrode patterns 101 through solder bumps 3, the first electrode patterns 101 are connected to the second conductive pattern 104 through at least one of the corresponding first connection pads 114 and at least one of the corresponding second connection pads 124, and the second conductive pattern 104 is connected to a G terminal 72 as a further portion of the fifth conductive pattern through at least one of the third conductive connection pads 134, at least one of the fourth conductive connection pads 144, and at least one of the fifth conductive connection pads 154. As a result, the first electrode pads 210 of the second micro-LED chips 200R and 200R of the different pixels 2a and 2b are electrically connected to each other (see FIG. 5).

The first electrodes 210 of the third micro-LED chips 200B and 200B of the different LED pixels 2a and 2b are connected to the corresponding first electrode patterns 101 through solder bumps 3, the first electrode patterns 101 are connected to the third conductive pattern 105 through at least one of the corresponding first connection pads 114, at least one of the corresponding second connection pads 124, and at least one of the corresponding third connection pads 134, and the third conductive pattern 105 is connected to a B terminal 73 as a further portion of the fifth conductive pattern through at least one of the fourth connection pads 144 and at least one of the fifth connection pads 154. As a result, the first electrodes of the second micro-LED chips 200R and 200R of the different pixels 2a and 2b are electrically connected to each other (see FIG. 6).

Figure 7:
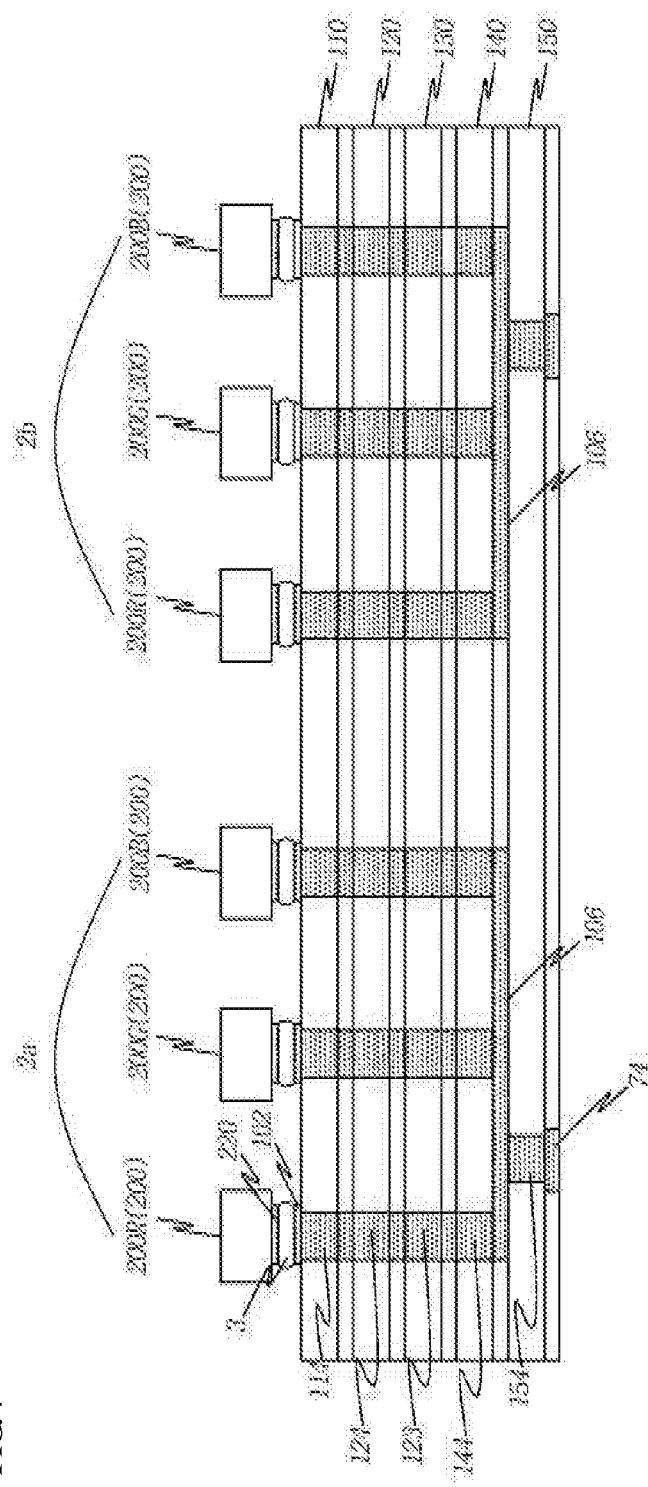
FIG. 7 is a cross-sectional view taken along line D-D of FIG. 3.

The second electrode pads 220 of the first, second, and third micro-LED chips 200R, 200G, and 200B of each pixel 2a or 2b are connected to the second electrode patterns 102 through solder bumps 3, the second electrode patterns 102 are connected to the fourth conductive pattern 106 through three interconnections, each including the corresponding first connection pad 114, the corresponding second connection pad 124, the corresponding third connection pad 134, and the corresponding fourth connection pad 144, and the fourth conductive pattern 106 is connected to a C terminal 74 as a further portion of the fifth conductive pattern through the corresponding fifth connection pad 154 (see FIG. 7).

As used herein, the terms "first connection pad", "second connection pad", "third connection pad", "fourth connection pad", and "fifth connection pad" refer to vias formed in the first flexible insulating film, the second flexible insulating film, the third flexible insulating film, the fourth flexible insulating film, and the fifth flexible insulating film, respectively. The connection pads formed in the same flexible insulating film are separated from one another but are denoted by the same reference numerals. The connection pads formed in one flexible insulating film are separated from those formed in other flexible insulating films. The same applies to the first via holes, the second via holes, the third via holes, the fourth via holes, and the fifth via holes. One or more insulating films may be present on the upper or lower surface of each flexible insulating film.

In the construction of the micro-LED module illustrated in FIGS. 2 to 7, the shapes and sizes of the via holes 112, 122, 132, 142, and 152 formed in the flexible insulating films 110, 120, 130, 140, and 150 have a great influence on the size of the micro-LED chips 200 and the intervals between the micro-LED chips 200.

Figure 8:
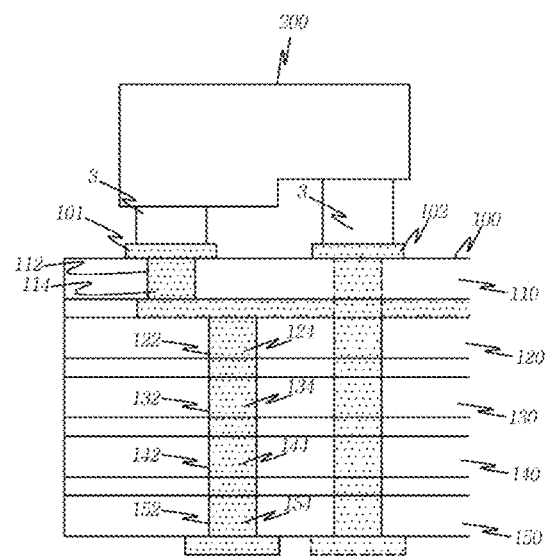
FIG. 8 illustrates a positional relationship between via holes and connection pads formed in the via holes relative to one micro-LED chip.

As illustrated in FIG. 8, the via holes 112 formed in the uppermost first flexible insulating film are cylindrical holes whose cross-sectional shape, diameter, and area are the same from one end to the other end. When the via holes 112 formed in the uppermost first flexible insulating film 110 are cylindrical and the first conductive connection pads 114 formed in the via holes 112 are solid or hollow cylindrical, the interval between the electrode patterns 101 and 102 on the upper surface of the flexible circuit board 100 can be sufficiently reduced, with the result that the size of the micro-LED chip 200 and the intervals between the micro-LED chips 200 and the adjacent micro-LED chips 200 can be sufficiently reduced. The second, third, fourth, and fifth via holes 122, 132, 142, and 152 formed in the flexible insulating films 120, 130, 140, and 150 are also cylindrical holes whose cross-sectional shape, diameter, and area are the same from one end to the other end and the connection pads formed therein are also solid or hollow cylindrical. Thus, even when the number of the vias in the same layer within the flexible circuit board 100 increases, interference between the vias can be prevented.

Figure 9:
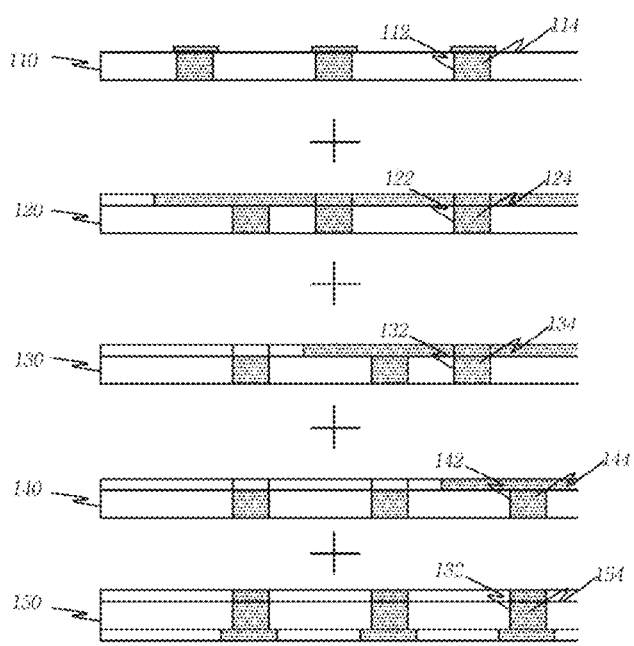
FIG. 9 is an exemplary view illustrating a stacked structure of a micro-LED module according to the present invention.

As illustrated in FIG. 9, the flexible circuit board is prepared by stacking the plurality of flexible insulating films 110, 120, 130, 140, and 150 on one another. The flexible insulating films 110, 120, 130, 140, and 150 include the cylindrical via holes 112, 122, 132, 142, and 152 and the connection pads 114, 124, 134, 144, and 154 filled in the via holes 112, 122, 132, 142, and 152, respectively. The electrode pads and the conductive patterns are formed on the upper surface of the flexible circuit board. The via holes 112, 122, 132, 142 or 152 are formed by applying a PR to the upper surface of a flexible substrate to form a PR film, arranging a mask on the PR film, and exposing the PR film through the mask. This photolithography procedure allows the via holes 112, 122, 132, 142, and 152 to have cylindrical shapes with substantially constant diameters over the entire length in the depth direction. The formation of the cylindrical via holes reduces the intervals between the electrode pads on the upper surface of the flexible circuit board, contributing to a reduction in the size of the micro-LED chips and the interval between the micro-LED chips, and prevents interference between the connection pads in the flexible circuit board.

Second Embodiment

FIG. 10 shows the positions of major external and internal parts of a vehicle to which a vehicle-mounted flexible display according to one embodiment of the present invention is applied.

Referring first to (a) of FIG. 10, reference numeral 10a indicates the outer surface of a front or rear door of a vehicle 1 and is herein referred to as the side surface of the vehicle. Reference numeral 10b is the outer surface of a roof panel and is herein referred to as the upper surface of the vehicle. Reference numeral 10c is the outer surface of a bonnet and is herein referred to as the upper surface of the vehicle together with the outer surface of the roof panel. Reference numeral 10d is the outer surface of a trunk or rear panel and is herein referred to as the rear surface of the vehicle. Reference numeral 10e is the outer surface of a front panel and is herein referred to as the front surface of the vehicle. An FPCB (110 of FIG. 11) of the vehicle-mounted flexible display according to the present invention may be attached to one of the side surface 10a, the upper surfaces 10b and 10c, the rear surface 10d, and the front surface 10e of the vehicle. The FPCB may be attached to other outer panels of the vehicle, for example, front glass, rear glass or side glass.

In (b) of FIGS. 10, 10f, 10g, 10h, 10i, 10j, and 10k indicate a door trim, a dashboard, a center fascia, a steering wheel, a sun visor, and a console box of the vehicle, respectively. As described below, a controller (140 of FIG. 11) of the vehicle-mounted flexible display according to the present invention may be placed in one of the parts 10f, 10g, 10h, 10i, 10j, and 10k of the vehicle.

FIG. 11 is a block diagram for explaining the concept of a vehicle-mounted flexible display according to one embodiment of the present invention.

Referring to FIG. 11, the vehicle-mounted flexible display includes a flexible printed circuit board (FPCB) 110, a plurality of pixels 120 including a plurality of micro-LED chips, and a clear coating layer 130. The plurality of pixels are represented as a micro-LED array 120. The vehicle-mounted flexible display further includes a controller 140. Herein, the FPCB 110, the micro-LED array 120 mounted on the FPCB 110, and optionally the clear coating layer 130 are also referred to as a micro-LED panel.

The entire surface of the FPCB 110 is attached to the surface of one of the outer panels 10a to 10e (herein collectively denoted by 10) of the vehicle. A micro-LED driving circuit (not shown) is arranged on the FPCB 110 to individually drive the plurality of micro-LED chips 120. The FPCB 110 can be attached along the profile of the outer panel of the vehicle due to its flexibility. As a result, the FPCB 110 is held in close contact with the outer panel of the vehicle, decreasing the possibility that the FPCB 110 may be peeled off from the outer panel of the vehicle during long-term use or while driving.

The plurality of micro-LED chips 120 are arrayed in a matrix to constitute the micro-LED array and are connected such that they are individually driven by the micro-LED driving circuit. The length of one side of each of the micro-LED chips 120 is substantially in the range of 10 to 100 μm. For full-color display, three micro-LED chips (R, G, and B of FIG. 12) are grouped to form one pixel (PX of FIG. 12).

The clear coating layer 130 serves to reflect external light such as natural light or illumination light and is arranged over the micro-LED chips 120. Particularly, the clear coating layer reflects UV light and may have a thickness of approximately 30 to 50 μm when coated with a low refractive index material.

The controller 140 controls the micro-LED driving circuit arranged on the FPCB 110 to individually drive the micro-LED chips. The controller 140 receives image or picture sources to be displayed from the outside and provides the sources to the display panel, i.e. the FPCB 110 and the micro-LED chips 120. The controller 140 controls ON/OFF of the panel. The controller 140 may be placed at a position in the vehicle for easy access by a driver or passenger. For example, the controller 140 may be placed in one of the door trim 10f, the dashboard 10g, the center fascia 10h, the steering wheel 10i, the sun visor 10j, and the console box 10k, as illustrated in (b) of FIG. 10, but is not limited to this position.

FIG. 12 illustrates a vehicle-mounted flexible display according to one embodiment of the present invention.

Referring to FIG. 12, the vehicle-mounted flexible display includes a micro-LED panel ((b) of FIG. 12) and a clear coating layer 130. As illustrated (a) of FIG. 12, a plurality of pixels PX are arranged in a matrix on an FPCB unit 110a to construct a micro-LED module. Each of the plurality of pixels PX includes a plurality of micro-LED chips R, G, and B. The plurality of micro-LED modules (whose number is N in (a) of FIG. 12) are arranged adjacent to each other to manufacture a micro-LED panel, as illustrated in (b) of FIG. 12. Then, the clear coating layer 130 is arranged on the micro-LED panel to fabricate the vehicle-mounted flexible display, as illustrated in (c) of FIG. 12. That is, the vehicle-mounted flexible display includes the clear coating layer 130 and the micro-LED panel. The micro-LED panel includes the plurality of micro-LED modules, each of which includes a plurality of FPCB units 110a, 110b, 110c, and 110d and a micro-LED arrays 120a, 120b, 120c, and 120d corresponding to the FPCB units. Each of the FPCB units 110 includes a mounting surface attachable to an outer panel of a vehicle over the entire area thereof (see 111 of FIG. 10 or 11). When the micro-LED panel consisting of the plurality of micro-LED modules (each of which includes the FPCB unit and the micro-LED array corresponding to the FPCB unit) is attached to a vehicle, the plurality of micro-LED modules are assembled and attached to an outer panel of the vehicle and the clear coating layer is attached thereto. Accordingly, the micro-LED panel can be attached corresponding to the profile of the outer panel of the vehicle.

It is also to be understood that the FPCB 110 having a mounting surface attachable to an outer panel of a vehicle over the entire area thereof, the micro-LED array 120 in which the plurality of pixels are arrayed in a matrix on the FPCB 110, and the clear coating layer 130 arranged on the micro-LED array 120 are combined into one structure attachable to the outer panel of the vehicle.

When the clear coating layer 130 is arranged on the micro-LED array 120, portions of the bottom of the clear coating layer 130 may be brought into contact with the FPCB 110. This increases the contact area of the clear coating layer throughout the flexible display and prevents the pixels, specifically the constituent micro-LED chips of the pixels, from being displaced from their correct positions, which will be explained with reference to FIG. 13.

FIG. 13 is a cross-sectional view illustrating the vehicle-mounted flexible display.

Referring to FIG. 13, portions of the bottom of the clear coating layer 130 are in contact with the FPCB 110. Reference numeral 135 indicates the portions of the bottom of the clear coating layer 130 in contact with the FPCB 110. By the portions 135, the contact area of the clear coating layer 130 is increased and the micro-LED chips mounted on the FPCB 110 are prevented from being displaced.

FIGS. 14 to 17 show vehicle-mounted flexible displays 100a, 100b, 100c, and 100d according to exemplary embodiments of the present invention that are applied to various outer panels of vehicles. As shown in FIGS. 14 to 17, each of the vehicle-mounted flexible displays can be attached on one area selected from the side, upper, and rear surfaces of a vehicle. Although not shown, each of the vehicle-mounted flexible displays may be attached to the front surface of a vehicle. Each of the vehicle-mounted flexible displays may be attached to a portion or the entire area of at least one of the side, upper, rear, and front surfaces of a vehicle. In this case, the entire surface of the FPCB 110 is attached along the profile of a portion or the entire area of at least one of the side, upper, rear, and front surfaces of a vehicle, as mentioned earlier.

Figure 14:
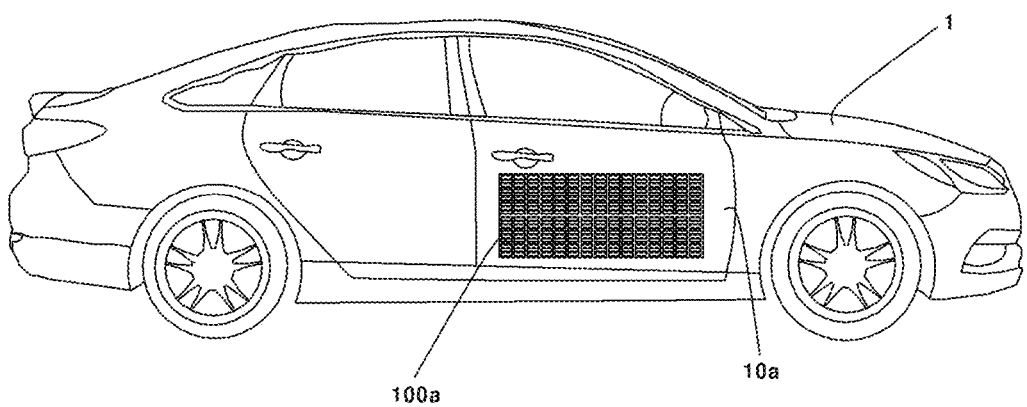

As shown in FIG. 14, the vehicle-mounted flexible display 100a is applied to the side surface 10a of a vehicle. Specifically, the entire surface of the FPCB 110 (FIG. 11) is attached to the side surface 10a of the vehicle such that the flexible display 100a remains attached to the side surface 10a of the vehicle. FIG. 14 exemplifies the flexible display 100a attached to only a portion of the side surface 10a of the vehicle. Alternatively, the flexible display 100a may be attached to the entire side surface of the vehicle, specifically the outer surface of the front door except the front door handle or the outer surface of the rear door except the rear door handle. The flexible display 100a may also be attached to the front or rear fender.

Figure 15:
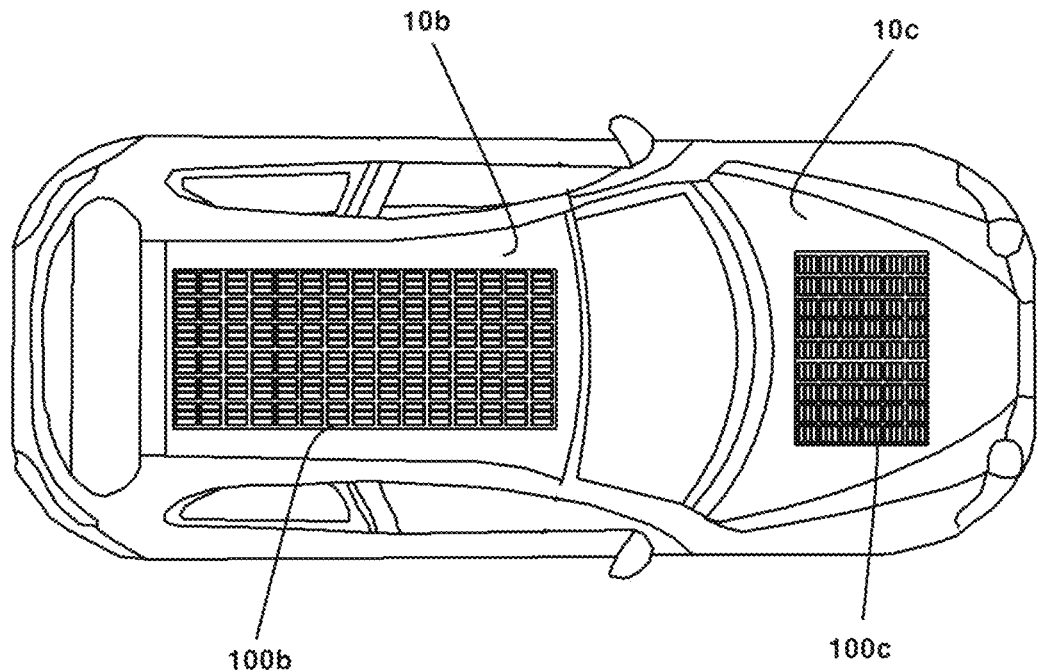
Figure 17:
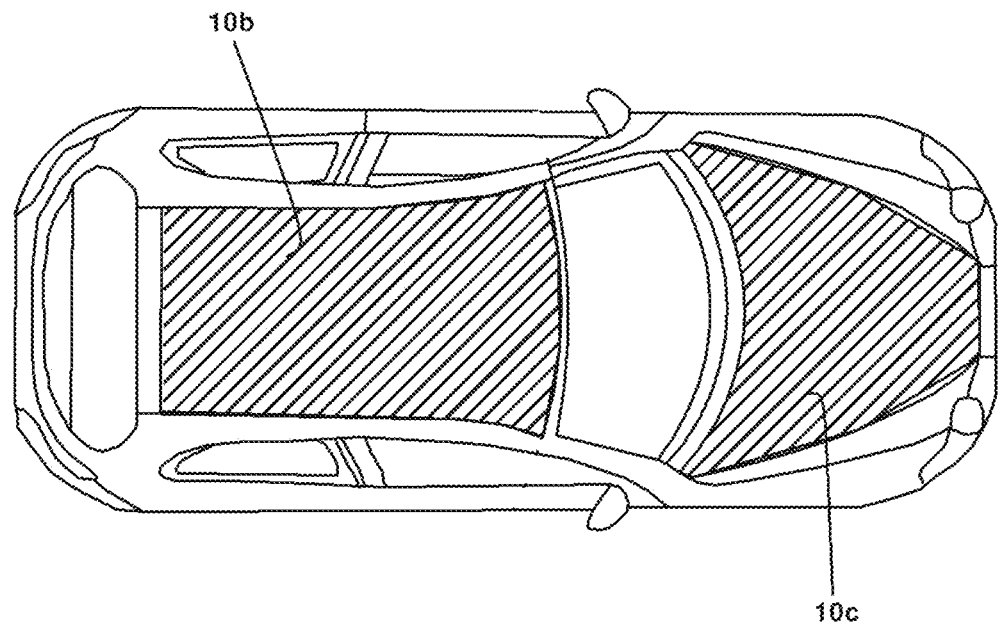

FIG. 15 shows the flexible displays 100b and 100c applied to the upper surfaces 10b and 10c of a vehicle, respectively. Specifically, the entire surface of the FPCB 110 (FIG. 11) is attached to the upper surface 10b of the vehicle such that the flexible display 100b remains attached to the upper surface 10b of the vehicle. The entire surface of the FPCB 110 (FIG. 11) is attached to the upper surface 10c of the vehicle such that the flexible display 100c remains attached to the upper surface 10c of the vehicle. FIG. 15 exemplifies the flexible displays 100b and 100c attached to only portions of the upper surfaces 10b and 10c of the vehicle. Alternatively, the flexible display 100b may be attached over the entire upper surface 10b of the vehicle and the flexible display 100c may be attached over the entire upper surface 10c of the vehicle, as shown in FIG. 17.

Figure 16:
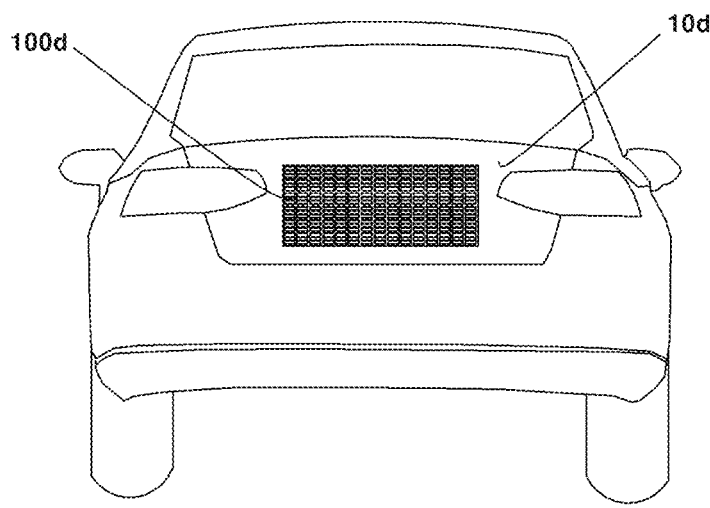

As shown in FIG. 16, the vehicle-mounted flexible display 100d is applied to the rear surface 10d of a vehicle. Specifically, the entire surface of the FPCB 110 (FIG. 11) is attached to the rear surface 10d of the vehicle such that the flexible display 100d remains attached to the rear surface 10d of the vehicle. FIG. 16 exemplifies the flexible display 100d attached to only a portion of the rear surface 10d of the vehicle. Alternatively, the flexible display 100d may be attached to the entire rear surface of the vehicle except the license plate.

FIG. 18 is a cross-sectional view illustrating a state in which a vehicle-mounted flexible display according to one embodiment of the present invention is attached to an outer panel of a vehicle. FIGS. 19 and 20 are cross-sectional views illustrating vehicle-mounted flexible displays according to exemplary embodiments of the present invention.

Referring first to FIG. 18, the vehicle-mounted flexible display of the present invention includes an FPCB 110 attached to an outer panel 10 of a vehicle, a plurality of pixels PX electrically connected to a micro-LED driving circuit (not illustrated) on the FPCB 110 to form a micro-LED array, and a clear coating layer 130 arranged over the pixels PX. As mentioned previously, each of the plurality of pixels PX includes a plurality of LED chips R, G, and B.

The formation of each pixel PX including of the first micro-LED chip R, the second micro-LED chip G, and the third micro-LED chip B is exemplified in FIGS. 19 and 20.

Referring to FIG. 19, the first micro-LED chip R, the second micro-LED chip G, and the third micro-LED chip B in each pixel PX may be chips that emit light of the same wavelength band. That is, the first micro-LED chip R, the second micro-LED chip G, and the third micro-LED chip B may be blue light emitting micro-LED chips. The first micro-LED chip R is covered with a first wavelength converting material F1. The first wavelength converting material F1 is a material capable of converting the wavelength of light emitted from the first micro-LED chip R into a longer wavelength. The second micro-LED chip G is covered with a second wavelength converting material F2. The wavelength converting material F2 is a material capable of converting the wavelength of light emitted from the second micro-LED chip G into a longer wavelength but not longer wavelength than the wavelength converted by the first wavelength converting material F1. The third micro-LED chip B is covered with a light transmitting material T1. The light transmitting material T1 is a material through which light emitted from the third micro-LED chip B is transmitted without wavelength conversion. Here, the first wavelength converting material F1 is located between the first micro-LED chip R and the clear coating layer 130, the second wavelength converting material F2 is located between the second micro-LED chip G and the clear coating layer 130, and the light transmitting material is located between the third micro-LED chip B and the clear coating layer 130. For example, the first wavelength converting material F1 may convert blue light emitted from the first micro-LED chip R into red and the second wavelength converting material F2 may convert blue light emitted from the second micro-LED chip G into red.

Referring to FIG. 20, each of the pixels PX is designed such that the first micro-LED chip R and the third micro-LED chip B emit light of the same wavelength band and the second micro-LED chip emits light at a longer wavelength than that of light emitted from the first micro-LED chip R. In each pixel PX, the first micro-LED chip R is covered with a first wavelength converting material F1 and each of the second micro-LED chip G and the third micro-LED chip B is covered with a light transmitting material T1. The first wavelength converting material F1 converts the wavelength of light emitted from the first micro-LED chip R into a longer wavelength than the wavelength of light emitted from the second micro-LED chip G. For example, the first micro-LED chip R and the third micro-LED chip B are blue light emitting chips, the second micro-LED chip G is a green light emitting chip, and the first wavelength converting material F1 is a material that converts blue light into red.

Here, the first wavelength converting material is located between the first micro-LED chip R and the clear coating layer 130 and the light transmitting material is located between the second micro-LED chip G and the clear coating layer 130 and between the third micro-LED chip B and the clear coating layer 130.

As illustrated in FIGS. 19 and 20, the FPCB 110 includes a mounting surface 111 through which one surface of the FPCB can be attached corresponding to the profile of an outer panel of a vehicle.

Most outer panels of a vehicle are from 0.7 mm to 0.8 mm in thickness. However, portions of a vehicle that are directly impacted from the roadway, for example, a portion of the car body where a shock absorber is mounted, have a thickness of about 2.3 mm Steel plates are used to increase the strength of outer panels. To this end, two or three steel plate pieces having a total thickness of about 1.2 to 1.6 mm are joined to each other by welding. The outer panel 10 to which the vehicle-mounted flexible display of the present invention is attached is manufactured by molding a large-sized steel plate without using steel plate pieces.

Although the vehicle-mounted flexible display of the present invention has been described herein, it should be noted that all embodiments are not encompassed in the description and the scope of the present invention is defined by the claims that follow.

Third Embodiment

Referring to FIGS. 23 to 25, a system for extending a driver's view according to one embodiment of the present invention is installed and used in a vehicle including a roof 3 and pillars supporting the roof 3. The pillars include an A-pillar 2, a B-pillar 4, and a C-pillar 6.

The A-pillar 2 is arranged adjacent to both sides of a windscreen 5 to support the windscreen 5 and the roof 3. The C-pillar 6 is arranged adjacent to both sides of a rear window 8 to support the rear window 8 and the roof 3. The B-pillar 4 is arranged across a side window 7 in a side door to support the roof 3.

The system includes an image acquisition unit 20 including one or more cameras 21, 22, and 23 acquiring images outside the vehicle that are blocked by the A-pillar 2, a micro-LED display panel 40 installed along the inner surface of the A-pillar 2, and an image processing unit 30 processing the images outside the vehicle that are acquired by the image acquisition unit and providing the processed external images to the micro-LED display panel 40.

The micro-LED display panel 40 is preferably installed so as to cover the entire inner surface of the A-pillar 2. The camera 21, 22 or 23 is placed on the outer surface of the A-pillar 2 or outside the vehicle adjacent to the outer surface of the A-pillar 2 to acquire images outside the vehicle that are visible to the driver when the A-pillar 2 is transparent (but is indeed opaque). The image processing unit 30 can communicate with the image acquisition unit 20 including the camera 21, 22 or 23 and the micro-LED display panel 40. The image processing unit 30 processes the images outside the vehicle acquired by the image acquisition unit 20 and provides the processed images to the micro-LED display panel 40.

The image processing unit 30 processes the images acquired by the image acquisition unit 20 into images substantially identical or similar to the images blocked by the A-pillar 2 and provides the processed images to the micro-LED display panel 40. Accordingly, the micro-LED display panel 40 can display the external images blocked by the A-pillar 2 on the driver in the vehicle.

When the driver moves his/her seat forward or backward or adjusts the height of his/her seat, his/her viewing angle to the A-pillar 2 and the micro-LED display panel 40 installed on the A-pillar 2 may change. This results in a large discrepancy between the images provided to the driver by the micro-LED display panel 40 and the actual external images. To overcome this discrepancy, the camera 21, 22 or 23 is designed to rotate a full 360° around one point. The viewing angle of the camera 21, 22 or 23 can also be adjusted. An actuator 50 is provided for easy adjustment of the rotation angle and/or viewing angle of the camera 21, 22 or 23. The actuator 50 is placed inside the vehicle, specifically in one of the center fascia 101, the dashboard 102, the steering wheel 103, the inner surface 104 of the door, and the inner surface of the pillar. A controller 60 may be provided to control the camera 21, 22 or 23 in response to the driver's input for operating the actuator 50. Alternatively, the camera 21, 22 or 23 may be controlled by tracking the driver's location instead of using the actuator 50.

The camera 21, 22 or 23 is preferably placed on the outer surface of the A-pillar 2 that is aligned with the driver's eyes when the driver 1 looks at the A-pillar 2. The position of the camera 21, 22 or 23 on the A-pillar 2 may be set depending on the driver's average body shape and average driving habits. According to this embodiment, the plurality of cameras 21, 22, and 23 are placed on the outer surface of the A-pillar 2 and are selectively used depending on the driver's average body shape or average driving habits. The rotation angle and viewing angle of the selected camera 21, 22 or 23 are adjusted such that the camera 21, 22 or 23 acquires images close to the actual external images. The selection and/or control of the camera 21, 22 or 23 can be automatically accomplished by the controller 60 based on signals of a sensor detecting the driver or the driver's body part. Alternatively, the camera may be selected and controlled by the controller 60 based on signals produced when the driver 1 operates the actuator placed around the driver's seat while watching the micro-LED display panel 40. It is noted that the camera is not placed on the outer surface of the A-pillar 2 but may be placed at a position other than the outer surface of the A-pillar or at a position (e.g., dashboard) inside the vehicle. The controller 60 can provide the micro-LED display panel 40 with images other than the images acquired by the image acquisition unit 20. Such images include navigation images and DMB images. In this case, the images may be selected by the driver's or passenger's input for operating the actuator.

The position of the micro-LED display panel 40 inside the A-pillar 2 beside the driver's seat and the position of the image acquisition unit 20 outside the A-pillar 2 have been described above but a micro-LED display panel 40' may be placed inside an A-pillar 2' beside the passenger seat and an image acquisition unit 20' may be placed outside the A-pillar 2'. In this case, an image processing unit 30' is provided to process images outside the vehicle that are acquired by the image acquisition unit 20' and provide the processed images to the micro-LED display panel 40'. The image acquisition unit 20' may include a camera 21' acquiring images when viewed by the passenger and a camera 22' acquiring images when viewed by the driver 1. The controller 60 selects the images acquired by the camera 22' or the images acquired by the camera 21' and provides the selected images to the micro-LED display panel 40'. Alternatively, the controller 60 can provide the micro-LED display panel 40' with images other than the images acquired by the image acquisition unit 20'. Such images include navigation images and DMB images. In this case, the images may be selected by the driver's or passenger's input for operating the actuator.

The system includes an auxiliary image acquisition unit 20" acquiring images outside the vehicle that are blocked by the C-pillar 6, an auxiliary micro-LED display panel 40" installed along the inner surface of the C-pillar 6, and an auxiliary image processing unit 30" processing the images outside the vehicle acquired by the image acquisition unit 20" and providing the processed images to the micro-LED display panel 40". The auxiliary image acquisition unit 20" may include a camera 21" acquiring images when viewed by a person sitting in the back seat and a camera 22" acquiring images when viewed by the driver 1. Here, the images when viewed by the driver may be images when the driver turns his/her head and reverses the vehicle for the purpose of parking or images when the driver looks back through a rearview mirror (not illustrated), particularly he/she looks the C-pillar 6 in the diagonal direction through a rearview mirror. The controller 60 selects the images acquired by the camera 22" or the images acquired by the camera 21" and provides the selected images to the micro-LED display panel 40". Alternatively, the controller 60 can provide the micro-LED display panel 40" with images other than the images acquired by the image acquisition unit 20". Such images include navigation images and DMB images. In this case, the images may be selected by the driver's or passenger's input for operating the actuator.

FIG. 26 is a cross-sectional view of the micro-LED display panel 40 installed on the inner surface of the A-pillar and FIG. 27 illustrates an array of LED chips 42R, 42G, and 42B provided in the micro-LED display panel 40. The construction of the micro-LED display panel installed on the C-pillar 6 may the same as that of the micro-LED display panel installed on the A-pillar 2 and its description is thus omitted.

Referring to FIGS. 26 and 27, the micro-LED display panel 40 includes a flexible substrate 41 attached to the inner surface of the A-pillar 2 and micro-LED pixels 42 having a size (maximum width) of 100 μm arrayed in a matrix on the flexible substrate 42. Each of the plurality of LED pixels 42 includes a red micro-LED chip 42R, a green micro-LED chip 42G, and a blue micro-LED chip 42B. The red micro-LED chip 42R and the green micro-LED chip 42G may be composed of semiconductors different from a semiconductor for the blue micro-LED chip. Alternatively, the red micro-LED chip 42R may be produced by forming a red wavelength converting material layer including red quantum dots on a blue micro-LED chip and the green micro-LED chip 42G may be produced by forming a green wavelength converting material layer including green quantum dots on a blue micro-LED chip.

According to the present invention, the micro-LED chips 42R, 42G, and 42B are flip-chip bonded to the flexible substrate 41 without using bonding wires. The flexible substrate 41 is previously formed with interconnection circuits. For example, each of the micro-LED chips is mounted on the flexible substrate 41 such that two electrode pads having different polarities are bonded to corresponding electrode patterns on the flexible substrate 41 without bonding wires, like a flip-chip type micro-LED chip, and can be turned ON/OFF. These micro-LED chips are herein defined as "wireless LED chips". The inner surface of the A-pillar 2 may be curved. The micro-LED display panel 40 can be attached along the curved inner surface of the A-pillar 2 due to the flexibility of the flexible substrate 41 and the presence of gaps between the plurality of micro-LED chips 42R, 42G, and 42B. The micro-LED display panel 40 may further include a top protective layer 43 covering the upper portions of the micro-LED chips 42R, 42G, and 42B. The top protective layer 43 may include a transparent resin. The flexible substrate 41 can be deformed along the shape of the inner surface of the A-pillar 2. The micro-LED chips 42R, 42G, and 42B mounted at micro-scale intervals on the flexible substrate 41 can be kept intact even when the flexible substrate 41 is deformed. The micro-LED display panel 40 may further include a protective layer 44 surrounding the micro-LED chips 42R, 42G, and 42B and the micro-LED pixels 2. The protective layer 44 is preferably formed using a flexible material that does not deteriorate the flexibility of the micro-LED display panel 40.

Although not described in detail above, the micro-LED display panel may also be installed on the B-pillar 4. Navigation image information and DMB image information as well as external image information can be output on the micro-LED display panel.

What is claimed is:

1. A micro-LED module comprising:
    a flexible circuit board comprising a first conductive pattern, a second conductive pattern, and a third conductive pattern; and
    a plurality of LED pixels, each of which comprises a first micro-LED chip electrically connected to the upper side of the first conductive pattern and having at least one side whose length is 100 μm or less, a second micro-LED chip electrically connected to the upper side of the second conductive pattern and having at least one side whose length is 100 μm or less, and a third micro-LED chip electrically connected to the upper side of the third conductive pattern and having at least one side whose length is 100 μm or less,
    wherein each of the first micro-LED chip, the second micro-LED chip, and the third micro-LED chip comprises at least one electrode pad having a width of 80 μm or less, the flexible circuit board comprises a first flexible insulating film formed on the upper surface of the first conductive pattern and a second flexible insulating film formed in contact with the lower surface of the first conductive pattern and the upper surface of the second conductive pattern, and the first flexible insulating film comprises a first via hole having the same cross section from the upper to the lower surface and a connection pad formed in the first via hole and electrically connected to the first conductive pattern.

2. The micro-LED module according to claim 1, wherein the flexible circuit board comprises at least one electrode pattern corresponding to each of the electrode pads of the first micro-LED chip, the second micro-LED chip, and the third micro-LED chip.

3. The micro-LED module according to claim 2, wherein the electrode pattern is electrically connected to the connection pad of the flexible circuit board.

4. The micro-LED module according to claim 1, wherein the second flexible insulating film comprises a second via hole having the same cross section from the upper to the lower surface and the first via hole and the second via hole are continuously formed.

5. The micro-LED module according to claim 1, wherein the first via hole is cylindrical in shape.

6. The micro-LED module according to claim 1, wherein the first flexible insulating film is stacked on and bonded to the second flexible insulating film such that the first connection pad is connected to a corresponding area of the second conductive pattern.

7. The micro-LED module according to claim 4, wherein the first via hole and the second via hole have the same cross-sectional area and shape.

8. The micro-LED module according to claim 1, wherein the first flexible insulating film is formed by subjecting a flexible substrate to photolithography to form the first via hole and filling a metal in the first via hole to form the connection pad.

9. A micro-LED module comprising:
    a flexible circuit board comprising a first conductive pattern, a second conductive pattern, a third conductive pattern, . . . , and an $n^{th}$ conductive pattern; and a plurality of LED pixels, each of which comprises a first micro-LED chip electrically connected to the upper side of the first conductive pattern and having at least one side whose length is 100 μm or less, a second micro-LED chip electrically connected to the upper side of the second conductive pattern and having at least one side whose length is 100 μm or less, and a third micro-LED chip electrically connected to the upper side of the third conductive pattern and having at least one side whose length is 100 μm or less, wherein each of the first micro-LED chip, the second micro-LED chip, and the third micro-LED chip comprises at least one electrode pad having a width of 80 μm or less, and the flexible circuit board further comprises a first flexible insulating film formed on the upper surface of the first conductive pattern, a second flexible insulating film formed between the first conductive pattern and the second conductive pattern, and an $n^{th}$ flexible insulating film formed between the $(n-1)^{th}$ conductive pattern and the $n^{th}$ conductive pattern, via holes having the same cross section from the upper surface of the first flexible insulating film to the lower surface of the $n^{th}$ flexible insulating film, and connection pads formed in the via holes and electrically connected to the first conductive pattern.

10. A micro-LED module comprising:
a flexible circuit board; and
a first LED pixel and a second LED pixel mounted on the flexible circuit board and each comprising a first micro-LED chip, a second micro-LED chip, and a third micro-LED chip, each of which has at least one side whose length is 100 μm or less,
wherein each of the first micro-LED chip, the second micro-LED chip, and the third micro-LED chip is of a flip-chip type comprising one or more first and second electrode pads, each of which has a width of 80 μm or less, on the surface facing the flexible circuit board, the flexible circuit board comprises a first flexible insulating film comprising electrode patterns comprising a first electrode pattern and a second electrode pattern formed on the upper surface thereof and connected to the electrode pads through solder bumps having a diameter of 80 μm or less, a second flexible insulating film connected to the bottom of the first flexible insulating film through first conductive patterns, a third flexible insulating film connected to the bottom of the second flexible insulating film through second conductive patterns, a fourth flexible insulating film connected to the bottom of the third flexible insulating film through third conductive patterns, and a fifth flexible insulating film connected to the bottom of the fourth flexible insulating film through fourth conductive patterns, the first flexible insulating film comprises a first interconnection comprising connection pads through which the first electrode pattern corresponding to the first electrode pad of the first micro-LED chip of the first LED pixel and the first electrode pattern corresponding to the first electrode pad of the second micro-LED chip are connected to the first conductive pattern, the first flexible insulating film and the second flexible insulating film comprise a second interconnection comprising connection pads through which the first electrode pattern corresponding to the first electrode pad of the second micro-LED chip of the first LED pixel and the first electrode pattern corresponding to the first electrode pad of the second micro-LED chip are connected to the second conductive pattern, the first flexible insulating film, the second flexible insulating film, and the third flexible insulating film comprise a third interconnection comprising connection pads through which the first electrode pattern corresponding to the first electrode pad of the third micro-LED chip of the first LED pixel and the first electrode pattern corresponding to the first electrode pad of the third micro-LED chip are connected to the third conductive pattern, and the connection pads of the first interconnection, the connection pads of the second interconnection, and the connection pads of the third interconnection have the same cross-sectional area and shape from the upper to the lower end.

11. The micro-LED module according to claim 10, wherein each of the connection pads of the first interconnection, the connection pads of the second interconnection, and the connection pads of the third interconnection is formed in a cylindrical via hole.

12. The micro-LED module according to claim 10, wherein the first flexible insulating film, the second flexible insulating film, the third flexible insulating film, and the fourth flexible insulating film comprise a fourth interconnection comprising connection pads through which the second electrode patterns corresponding to the second electrode pads of the first micro-LED chip, the second micro-LED chip, and the third micro-LED chip of the first LED pixel or the second LED pixel are connected to the fourth conductive pattern, and the connection pads of the fourth interconnection have the same cross-sectional area and shape from the upper to the lower end.

13. The micro-LED module according to claim 12, wherein each of the connection pads of the fourth interconnection is formed in a cylindrical via hole.

* * * * *